US010026656B2

(12) United States Patent
Chuang et al.

(10) Patent No.: US 10,026,656 B2
(45) Date of Patent: Jul. 17, 2018

(54) METAL GATE FEATURES OF SEMICONDUCTOR DIE

(71) Applicant: TAIWAN SEMICONDUCTOR MANUFACTURING COMPANY, LTD., Hsinchu (TW)

(72) Inventors: Harry-Hak-Lay Chuang, Singapore (SG); Cheng-Cheng Kuo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 38 days.

(21) Appl. No.: 14/496,399

(22) Filed: Sep. 25, 2014

(65) Prior Publication Data

US 2015/0048456 A1 Feb. 19, 2015

Related U.S. Application Data

(63) Continuation-in-part of application No. 13/312,306, filed on Dec. 6, 2011, now Pat. No. 9,006,860.

(51) Int. Cl.
*H01L 21/8238* (2006.01)
*H01L 27/092* (2006.01)
(Continued)

(52) U.S. Cl.
CPC .......... *H01L 21/823828* (2013.01); *H01L 21/82385* (2013.01); *H01L 21/823842* (2013.01);
(Continued)

(58) Field of Classification Search
CPC ..... H01L 21/823828; H01L 21/823878; H01L 21/823842; H01L 21/82385; H01L 27/092;
(Continued)

(56) References Cited

U.S. PATENT DOCUMENTS 5,493,135 A 2/1996 Yin
7,772,070 B2 8/2010 Kitajima et al.
(Continued)

FOREIGN PATENT DOCUMENTS

| JP | 2007-250705 | 9/2007 |
| JP | 2007-311818 | 11/2007 |
| JP | 2010-206198 | 9/2010 |
| KR | 10-2006-0134010 | 12/2006 |
| TW | 200802628 | 1/2008 |

*Primary Examiner* — Tom Thomas
*Assistant Examiner* — Nilufa Rahim
(74) *Attorney, Agent, or Firm* — Hauptman Ham, LLP

(57) ABSTRACT

A semiconductor die comprises two or more active regions over a substrate. A first set of dummy blocks are over the substrate, in contact with one another, and completely surrounding at least one of the two or more active regions. A second set of dummy blocks are over the substrate and farther from the at least one active region surrounded by the first set of dummy blocks than the dummy blocks of the first set of dummy blocks. Each of the dummy blocks of the first set of dummy blocks has individual surface areas, each of the dummy blocks of the second set of dummy blocks has individual surface areas, and the individual surface areas of each of the dummy blocks of the second set of dummy blocks is larger than the individual surface areas of each of the dummy blocks of the first set of dummy blocks.

20 Claims, 17 Drawing Sheets

(51) Int. Cl.
*H01L 29/49* (2006.01)
*H01L 29/66* (2006.01)
*H01L 27/02* (2006.01)
*H01L 27/06* (2006.01)

(52) U.S. Cl.
CPC .. *H01L 21/823878* (2013.01); *H01L 27/0207* (2013.01); *H01L 27/0629* (2013.01); *H01L 27/092* (2013.01); *H01L 27/0922* (2013.01); *H01L 29/4966* (2013.01); *H01L 29/66545* (2013.01)

(58) Field of Classification Search
CPC ............ H01L 27/0629; H01L 27/0207; H01L 27/0922; H01L 29/66545
See application file for complete search history.

(56) References Cited

U.S. PATENT DOCUMENTS

| | | | |
|---|---|---|---|
| 7,934,173 B2* | 4/2011 | Shyu | G03F 1/36 430/5 |
| 2002/0058374 A1 | 5/2002 | Kim et al. | |
| 2006/0202282 A1* | 9/2006 | Kuroda | H01L 21/31053 257/374 |
| 2008/0003734 A1 | 1/2008 | Chuang et al. | |
| 2009/0090977 A1 | 4/2009 | Freeman et al. | |
| 2010/0052060 A1* | 3/2010 | Lai | H01L 21/31053 257/368 |
| 2013/0040434 A1* | 2/2013 | Tomita | H01L 21/31053 438/294 |

* cited by examiner

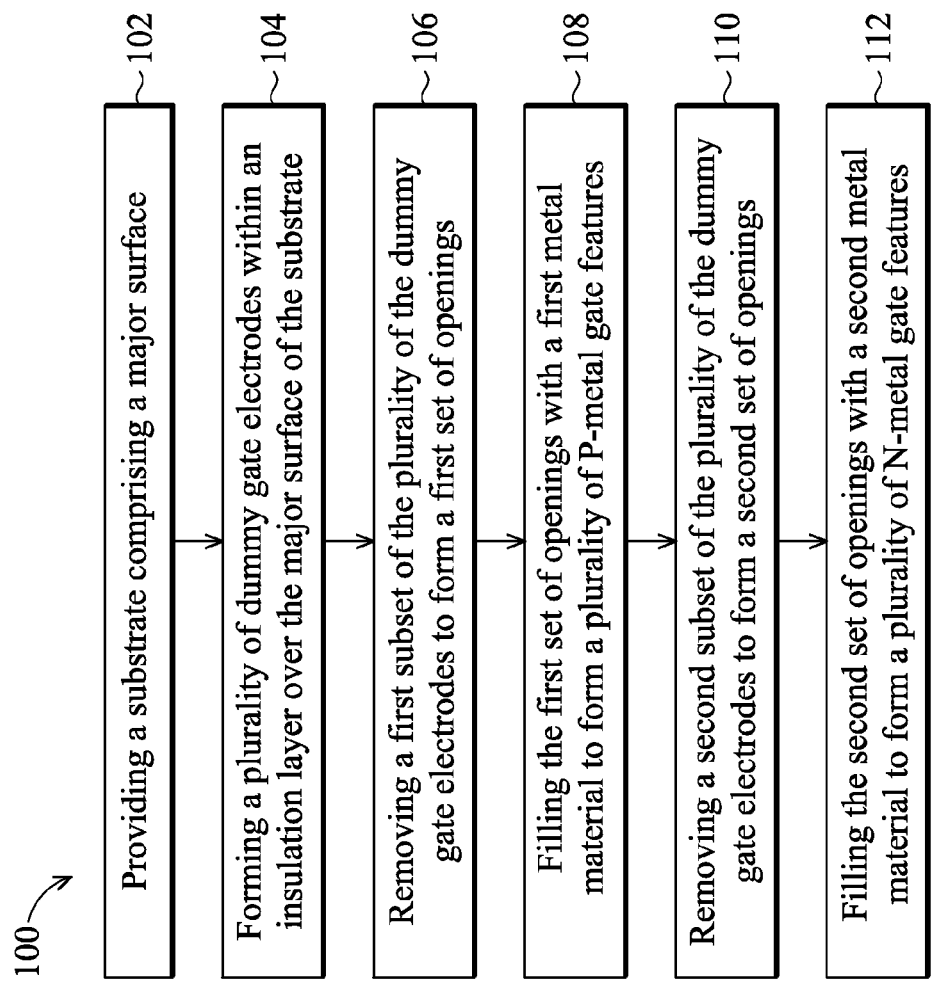

METAL GATE FEATURES OF SEMICONDUCTOR DIE

PRIORITY

The present application is a continuation-in-part of U.S. application Ser. No. 13/312,306, filed Dec. 6, 2011, which is incorporated herein by reference in its entirety.

FIELD OF THE INVENTION

One or more embodiments of the present disclosure relate to integrated circuit fabrication and, more particularly, to a semiconductor die with metal gate features.

BACKGROUND

As technology nodes shrink, in some integrated circuit (IC) designs, there has been a desire to replace the typically polysilicon gate feature with a metal gate feature to improve device performance with the decreased feature sizes. One process of forming a metal gate feature is termed a "gate last" process in which the final gate feature is fabricated "last" which allows for a reduced number of subsequent processes, including high temperature processing, that must be performed after formation of the gate.

However, there are challenges to implement such features and processes in complementary metal-oxide-semiconductor (CMOS) fabrication. As the gate length and spacing between devices decrease, these problems are exacerbated. For example, in a "gate last" fabrication process, non-uniform distribution of metal gate features causes loading effects during an etching process and/or a chemical-mechanical polishing (CMP) process, thereby increasing the likelihood of device instability and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

FIG. 1 is a flowchart illustrating a method of fabricating a CMOS semiconductor die according to various aspects of the present disclosure;

DETAILED DESCRIPTION

Figure 2B:
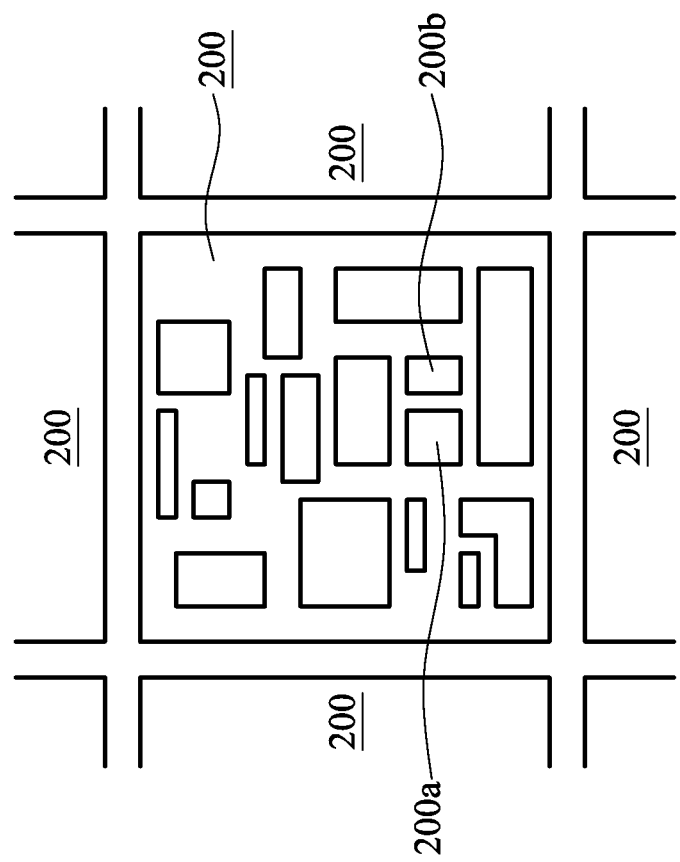
FIG. 2B shows a top view of a portion of the exemplary wafer of FIG. 2A according to embodiments various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2A:
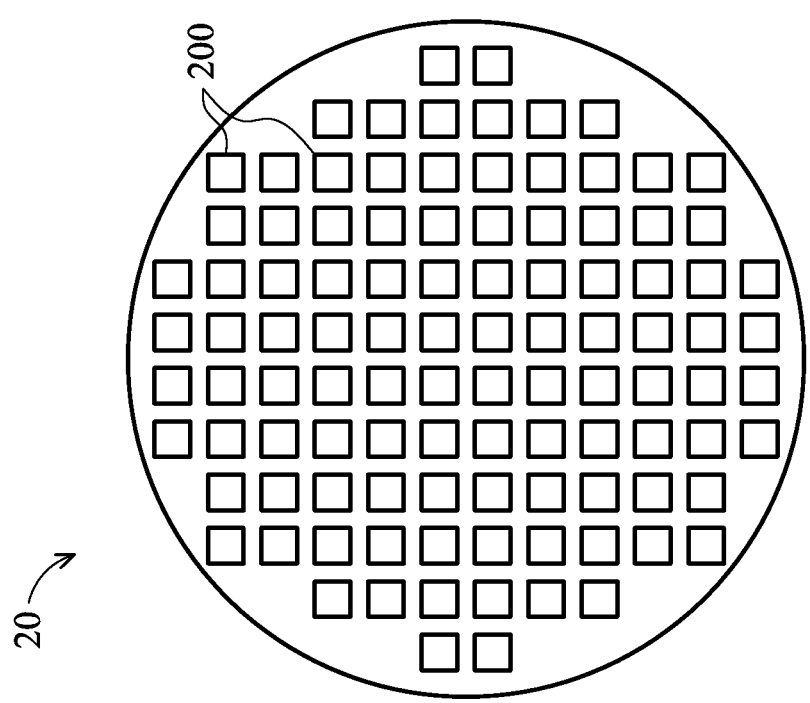
FIG. 2A shows a top view of an exemplary wafer having a plurality of individual CMOS semiconductor dies according to various aspects of the present disclosure.
Figure 2C:
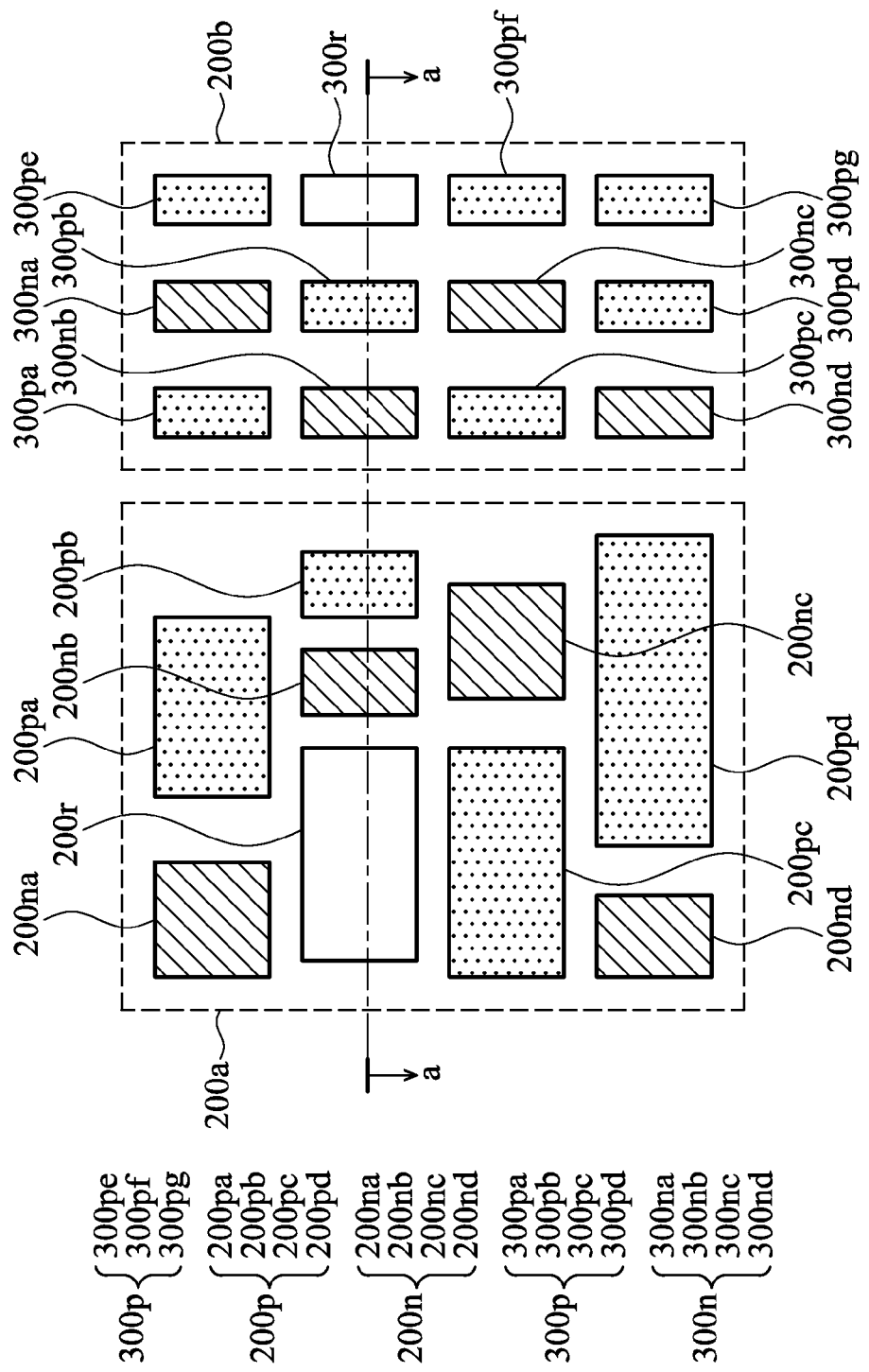
FIG. 2C shows a top view of a portion of one of the CMOS semiconductor dies in the exemplary wafer of FIGS. 2A and 2B according to various aspects of the present disclosure.

FIG. 1 is a flowchart illustrating a method 100 of fabricating a complementary metal-oxide-semiconductor (CMOS) semiconductor die according to various aspects of the present disclosure. FIG. 2A shows a top view of an exemplary wafer 20 having a plurality of individual CMOS semiconductor dies 200 according to various aspects of the present disclosure; FIG. 2B shows a top view of a portion of the exemplary wafer 200 of FIG. 2A according to various aspects of the present disclosure; FIG. 2C shows a top view of a portion of one of the CMOS semiconductor dies 200 in the exemplary wafer 20 of FIGS. 2A and 2B according to various aspects of the present disclosure; and FIGS. 3A-3F show cross-section views taken along the line a-a of FIG. 2C at various stages of fabrication according to various aspects of the present disclosure. In some embodiments, at least a part of the semiconductor die 200 is fabricated with CMOS technology processing. Accordingly, it is understood that additional processes are optionally provided before, during, and after the method 100 of FIG. 1, and that some other processes are only briefly described herein. Also, FIGS. 1 through 3F are simplified for a better understanding of the concepts of the present disclosure. For example, although the figures illustrate metal gate electrodes for the semiconductor die 200, it is understood the semiconductor die 200 is, in some embodiments, a part of an integrated circuit (IC) that comprises a number of other devices comprising resistors, capacitors, inductors, fuses, etc.

FIG. 2A illustrates the exemplary wafer 20 having the plurality of individual CMOS semiconductor dies 200 fabricated by a "gate last" process. FIG. 2B illustrates a portion of the exemplary wafer 20 of FIG. 2A comprising the exemplary semiconductor die 200, wherein the semiconductor die 200 comprises various conductive regions comprising a first conductive region 200a and a second conductive region 200b.

In one embodiment, the semiconductor die 200 comprises an insulation layer 224 over a major surface 202s of a substrate 202 (shown in FIGS. 3A-3F). FIG. 2C illustrates a portion of the semiconductor die 200 following the "gate last" process to form the first conductive region 200a with a plurality of conductive structures (e.g., P-metal gate features 200p, N-metal gate features 200n, resistor features 200r, etc.) within the insulation layer 224. The plurality of conductive structures is electrically coupled with one or more electrical components (e.g., comprising but not limited to resistors, capacitors, inductors, transistors, diodes, etc., not shown) in the semiconductor die 200 for interconnecting such components to form a desired circuit.

In the present embodiment, the P-metal gate features 200p comprise a plurality of P-metal gate areas 200pa, 200pb, 200pc, and 200pd while the N-metal gate features 200n comprise a plurality of N-metal gate areas 200na, 200nb, 200nc, and 200nd. In the depicted embodiment, the plurality of P-metal gate areas 200pa, 200pb, 200pc, and 200pd formed within the insulation layer 224 is collectively covering a first area of the major surface 202s while the plurality of N-metal gate areas 200na, 200nb, 200nc, and 200nd formed within the insulation layer 224 is collectively covering a second area of the major surface 202s, wherein a first ratio of the first area to the second area is equal to or greater than 1. In one embodiment, the first ratio is from 1 to 3.

In some embodiments, the resistor features 200r comprise a plurality of resistor areas (also referred as 200r) formed within the insulation layer 224, collectively covering a fifth area of the major surface 202s. In one embodiment, a third ratio of the fifth area to a sum of the first area and second area is less than 0.05.

The illustrated portion of the semiconductor die 200 in FIG. 2C also comprises the second conductive region 200b with a plurality of dummy conductive structures (e.g., dummy P-metal gate features 300p, dummy N-metal gate features 300n, dummy resistor features 300r, etc.) within the insulation layer 224. The plurality of dummy conductive structures is electrically isolated from one or more electrical components (e.g., comprising but not limited to resistors, capacitors, inductors, transistors, diodes, etc., not shown) in the semiconductor die 200 for improving non-uniform distribution of metal gate electrodes to form a desired circuit.

In the present embodiment, the dummy P-metal gate features 300p comprise a plurality of dummy P-metal gate areas 300pa, 300pb, 300pc, 300pd, 300pe, 300pf and 300pg while the dummy N-metal gate features 300n comprise a plurality of dummy N-metal gate areas 300na, 300nb, 300nc, and 300nd. In the depicted embodiment, the plurality of dummy P-metal gate areas 300pa, 300pb, 300pc, 300pd, 300pe, 300pf and 300pg formed within the insulation layer 224 is collectively covering a third area of the major surface 202s while the plurality of dummy N-metal gate areas 300na, 300nb, 300nc, and 300nd formed within the insulation layer 224 is collectively covering a fourth area of the major surface 202s, wherein a second ratio of the third area to the fourth area is substantially equal to the first ratio. In one embodiment, the second ratio is from 1 to 3.

In some embodiments, the dummy resistor features 300r comprises a plurality of dummy resistor areas (also referred as 300r) formed within the insulation layer 224 collectively covering a sixth area of the major surface 202s. In one embodiment, a fourth ratio of the sixth area to a sum of the third area and fourth area is less than 0.05.

In one embodiment, each of the plurality of dummy P-metal gate areas 300pa, 300pb, 300pc, 300pd, 300pe, 300pf and 300pg has a similar shape to the other dummy P-metal gate areas 300pa, 300pb, 300pc, 300pd, 300pe, 300pf and 300pg. In another embodiment, each of the plurality of dummy P-metal gate areas 300pa, 300pb, 300pc, 300pd, 300pe, 300pf and 300pg is of similar size.

In one embodiment, each of the plurality of dummy N-metal gate areas 300na, 300nb, 300nc, and 300nd has a similar shape to the other dummy N-metal gate areas 300na, 300nb, 300nc, and 300nd. In another embodiment, each of the plurality of dummy N-metal gate areas 300na, 300nb, 300nc, and 300nd is of similar size.

In some embodiments, each of the plurality of dummy P-metal gate areas 300pa, 300pb, 300pc, 300pd, 300pe, 300pf and 300pg has a similar shape to each of the plurality of dummy N-metal gate areas 300na, 300nb, 300nc, and 300nd. In some embodiments, each of the plurality of dummy P-metal gate areas 300pa, 300pb, 300pc, 300pd, 300pe, 300pf and 300pg has a similar size to each of the plurality of dummy N-metal gate areas 300na, 300nb, 300nc, and 300nd.

In some embodiments, one (e.g., 300nc) of the plurality of dummy N-metal gate areas 300na, 300nb, 300nc, and 300nd is between two of the dummy P-metal gate areas (e.g. 300pb and 300pd). In some embodiments, one (e.g., 300pc) of the plurality of dummy P-metal gate areas 300pa, 300pb, 300pc, 300pd, 300pe, 300pf and 300pg is between two of the dummy N-metal gate areas (e.g., 300nb and 300nd).

In some embodiments, one (e.g., 300nb) of the plurality of dummy N-metal gate areas is between one (e.g., 300pb) of the dummy P-metal gate areas and one (e.g., 200pb) of the plurality of P-metal gate areas. In some embodiments, one (e.g. 300pc) of the plurality of dummy P-metal gate areas is between one (e.g., 300nc) of the dummy N-metal gate areas and one (e.g., 200nc) of the plurality of N-metal gate areas.

Figure 3A:
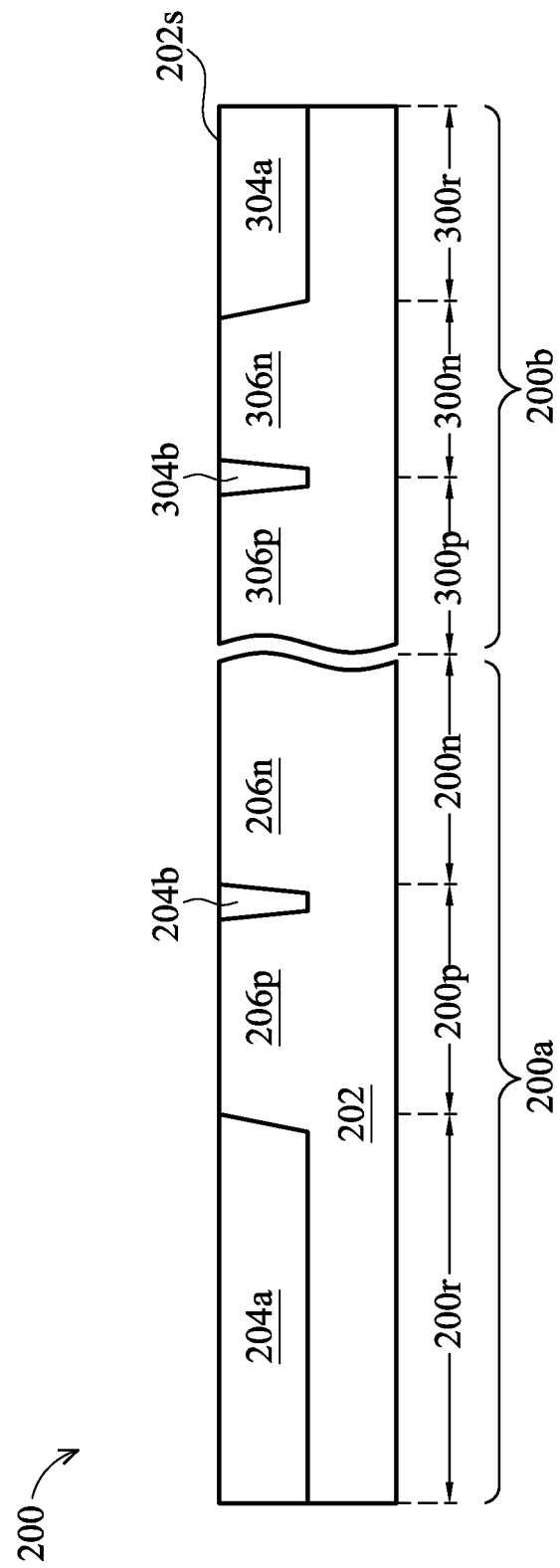
FIGS. 3A-3F show cross-section views taken along the line a-a of FIG. 2C at various stages of fabrication according to various aspects of the present disclosure.

Referring to FIGS. 1 and 3A, the method 100 begins with step 102 in which a substrate 202 comprising a major surface 202s is provided, wherein the substrate 202 comprises the first conductive region 200a and the second conductive region 200b. The substrate 202 comprises comprise a silicon substrate. In some embodiments, the substrate 202 comprises silicon germanium, gallium arsenic, or other suitable semiconductor materials. In some embodiments, the substrate 202 comprises other features such as various doped regions, a buried layer, and/or an epitaxial (epi) layer. In some embodiments, the substrate 202 is a semiconductor on insulator such as silicon on insulator (SOI). In some embodiments, the semiconductor substrate 202 comprises a doped epi layer, a gradient semiconductor layer, and/or a semiconductor layer overlying another semiconductor layer of a different type such as a silicon layer on a silicon germanium layer. In some embodiments, the semiconductor substrate 202 is a compound semiconductor substrate that comprises a multilayer silicon structure or a multilayer compound semiconductor structure.

Isolation regions such as shallow trench isolation (STI) are formed on the substrate 202 to define and electrically isolate the various active regions from each other. The isolation regions comprise materials such as silicon oxide, silicon nitride, silicon oxynitride, fluoride-doped silicate glass (FSG), a low-k dielectric material, other suitable materials, and/or combinations thereof. The STI is formed by any suitable process. In some embodiments, the formation of the STI includes patterning the semiconductor substrate by a photolithography process, etching a trench in the substrate (for example, by using a dry etching, wet etching, and/or plasma etching process), and filling the trench (for example, by using a chemical vapor deposition process) with a dielectric material. In some embodiments, the filled trench has a multi-layer structure such as a thermal oxide liner layer filled with silicon nitride or silicon oxide.

In some embodiments, the first conductive region 200a comprises a first STI 204a and a second STI 204b, wherein the second STI 204b isolates a P-active region 206p and an N-active region 206n. In some embodiments, the second conductive region 200b comprises a third STI 304b and a fourth STI 304a, wherein the third STI 304b isolates a P-active region 306p and an N-active region 306n. In some embodiments, the second conductive region 200b fully comprises a STI (not shown).

The P-active regions 206p, 306p and N-active regions 206n, 306n comprise various doping configurations depending on design requirements. In some embodiments, the P-active regions 206p, 306p are doped with p-type dopants, such as boron or $BF_2$, and the N-active regions 206n, 306n are doped with n-type dopants, such as phosphorus or arsenic. The P-active regions 206p, 306p are regions configured for p-type metal-oxide-semiconductor field-effect transistors (referred to as pMOSFETs), and the N-active regions 206n and 306n are regions configured for n-type metal-oxide-semiconductor field-effect transistors (referred to as nMOSFETs).

Figure 3B:
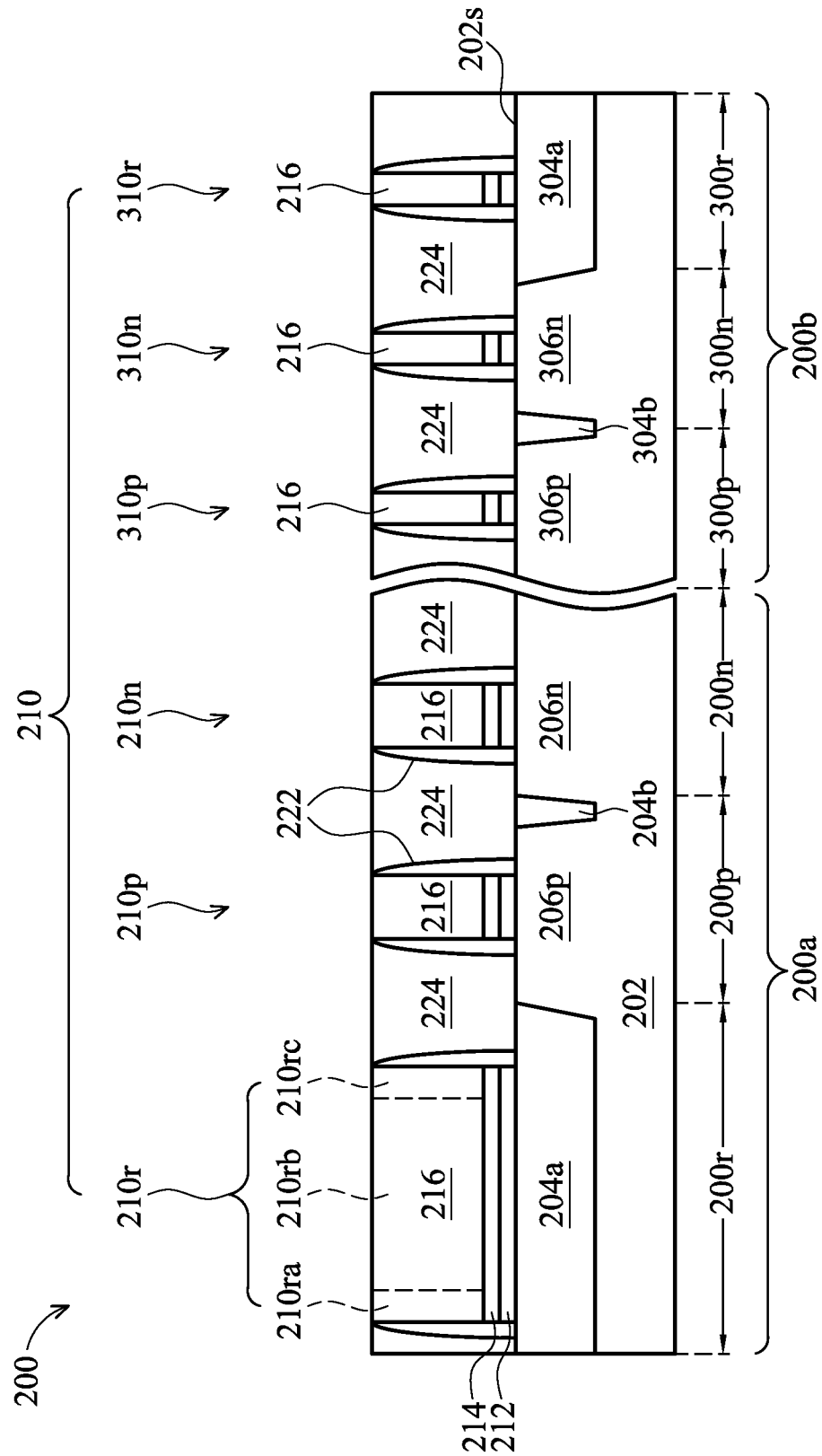

The method 100 continues with step 104 in which the structure in FIG. 3B is produced by forming a plurality of dummy gate electrodes 210 (denoted as 210p, 210n, 210r, 310p, 310n, and 310r) within an insulation layer 224 over the major surface 202s of the substrate 202. In the depicted embodiments, some dummy gate electrodes 210p, 210n, and 210r are located in the first conductive region 200a while some dummy gate electrodes 310p, 310n, and 310r are located in the second conductive region 200b. In some embodiments, a first subset (e.g., 210p and 310p) of the dummy gate electrodes 210 is formed over the P-active regions 206p, 306p while a second subset (e.g., 210n and 310n) of the dummy gate electrodes 210 is formed over the N-active regions 206n, 306n. In some embodiments, a third subset (e.g., 210r and 310r) of the dummy gate electrodes 210 is formed over the STIs 204a, 304a. In some embodiments, the dummy gate electrode 210r comprises a first portion 210ra, a second portion 210rb, and a third portion 210rc between the first portion 210ra and the second portion 210rb.

A gate dielectric layer 212 is formed over the substrate 202. The gate dielectric layer 212 is a high-k dielectric layer comprising $HfO_x$ with a thickness in the range of about 10 to 30 angstroms. In some embodiments, the gate dielectric layer 212 comprises silicon oxide, silicon nitride, silicon oxynitride, a high-k dielectric, or other suitable material. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and mixtures thereof. The gate dielectric layer 212 is formed using a suitable process such as atomic layer deposition (ALD), chemical vapor deposition (CVD), physical vapor deposition (PVD), thermal oxidation, UV-ozone oxidation, or combinations thereof. In some embodiments, the gate dielectric layer 212 comprises an interfacial layer (not shown) to reduce damage between the gate dielectric layer 212 and the substrate 202. The interfacial layer comprises silicon oxide or an other suitable material.

A TiN layer 214 is deposited over the gate dielectric layer 212 to reduce Al atomic diffusion of an N-metal gate electrode to the gate dielectric layer 212. The TiN layer 214 is a portion of a resistor. In the depicted embodiment, the TiN layer 214 has a thickness ranging from 5 to 15 angstroms. The TiN layer 214 is formed by CVD, PVD or other suitable technique.

In a gate last process, a dummy gate electrode 216 is formed over the TiN layer 214. The dummy gate electrode 216 comprises a single layer structure. In some embodiments, the dummy gate electrode 126 comprises a multilayer structure. The dummy gate electrode 216 comprises poly-silicon or another suitable material. In some embodiments, the dummy gate electrode 216 comprises doped poly-silicon with a uniform or gradient doping profile. The dummy gate electrode 216 has a thickness in the range of about 30 nm to about 60 nm. The dummy gate electrode 216 is formed using a low-pressure chemical vapor deposition (LPCVD) process or a plasma-enhanced chemical vapor deposition (PECVD) process.

The dummy gate electrode 216, TiN layer 214 and gate dielectric layer 212 are patterned to produce the structure shown in FIG. 3B. A layer of photoresist (not shown) is formed over the dummy gate electrode 216 by a suitable process, such as spin-on coating, and patterned to form a patterned photoresist feature over the dummy gate electrode 216 by a proper lithography patterning method. A width of the patterned photoresist feature is in the range of about 10 to 45 nm. In some embodiments, the patterned photoresist feature is transferred using a dry etching process to the underlying layers (i.e., the gate dielectric layer 212, TiN layer 214 and dummy gate electrode 216) to form the plurality of the dummy gate electrodes 210. The photoresist layer is optionally stripped thereafter.

In some embodiments, the CMOS semiconductor die 200 undergoes other "gate last" processes and other CMOS technology processing to form various features of the CMOS semiconductor die 200. As such, the various features are only briefly discussed herein. In some embodiments, the various components of the CMOS semiconductor die 200 are formed prior to formation of P-metal gate features and N-metal gate features in a "gate last" process. In some embodiments, the various components comprise lightly doped source/drain regions (p-type and n-type LDD) and source/drain regions (p-type and n-type S/D) (not shown) in the active regions 206p, 206n, 306p, and 306n. The p-type LDD and S/D regions are doped with B, In, or other suitable dopant, and the n-type LDD and S/D regions are doped with P, As, or other suitable dopant. In some embodiments, semiconductor die 200 includes gate spacers 222 that surround the plurality of the dummy gate electrodes 210. The gate spacers 222 are formed of silicon oxide, silicon nitride or other suitable materials. The insulation layer 224 includes an oxide formed by a high-aspect-ratio process (HARP) and/or a high-density-plasma (HDP) deposition process.

The process steps up to this point have provided the plurality of the dummy gate electrodes 210 within the insulation layer 224 over the major surface 202s of the substrate 202. Some dummy gate electrodes 210p and 210r are protected while other dummy gate electrodes 210n, 310p, 310n, and 310r are simultaneously removed to make space for a plurality of resulting metal gate features that are to be formed in place of the removed dummy gate electrodes 210n, 310p, 310n, and 310r. For example, a N-metal gate feature is formed in place of a removed dummy gate electrode 210n and a plurality of dummy N-metal gate features are formed in place of a plurality of removed dummy gate electrodes 310p, 310n, and 310r. The dummy gate electrode 210p is removed to make space for a P-metal gate feature that is to be formed in place of the removed dummy gate electrode 210p. The non-uniform distribution of the different metal gate features (i.e., the P-metal gate features and the N-metal gate features) causes loading effects during a chemical-mechanical polishing (CMP) process for a gate-last process, thereby increasing the likelihood of device instability and/or device failure.

Accordingly, the processing discussed below with reference to FIGS. 3C-3F may optimize distribution of the different metal gate electrodes by controlling a gate area ratio. The optimized distribution of the different metal gate electrodes is more effective at preventing the CMP loading effects that exist in a gate-last process. Accordingly, the discussed method of fabricating a CMOS semiconductor die helps the different metal gate electrodes to maintain their uniformities, thereby improving the CMOS device's performance.

Figure 3C:
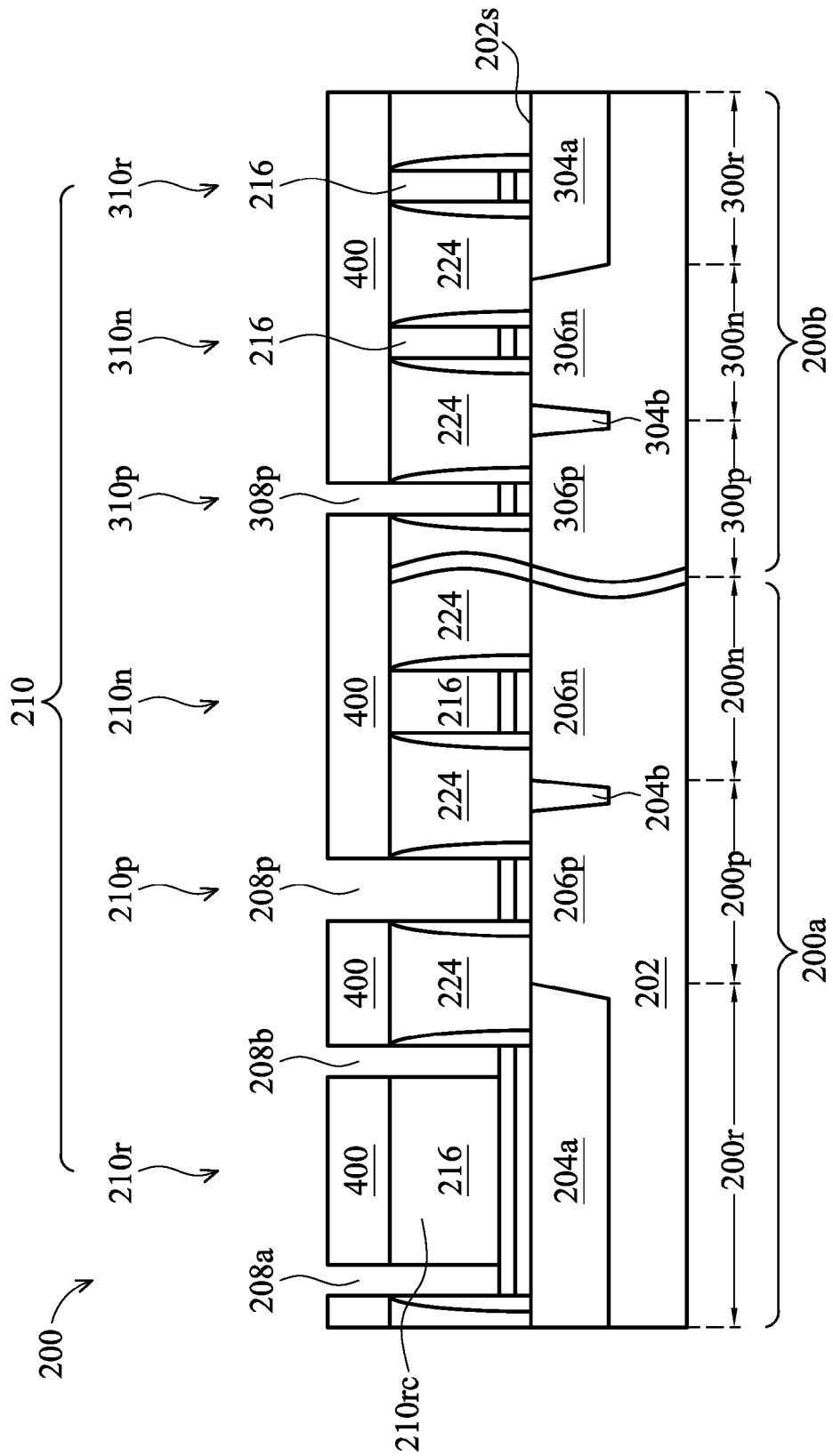

The method 100 in FIG. 1 continues with step 106 in which the structure in FIG. 3C is produced by removing the first subset (i.e. 210p and 310p) of the plurality of the dummy gate electrodes 210 to form a first set of openings 208p, 308p, and optionally removing the first portion 210ra and the second portion 210rb of the dummy gate electrode 210r to form a third set of openings 208a, 208b. In the depicted embodiment, using a patterned photo-sensitive layer 400 as a mask, the first subset (i.e. 210p and 310p) of the plurality of the dummy gate electrodes 210 are removed to form the first set of openings 208p, 308p. The first portion 210ra and the second portion 210rb of the dummy gate electrode 210r are removed to form the third set of openings 208a, 208b. The dummy gate electrodes 210n, 310n, 310r and the third portion 210rc of the dummy gate electrode 210r are covered by the patterned photo-sensitive layer 400.

In some embodiments, the first subset (i.e., 210p and 310p) of the plurality of the dummy gate electrodes 210 and the first portion 210ra and the second portion 210rb of the dummy gate electrode 210r are removed using a dry etch process. In some embodiments, the dry etch process is performed under a source power of about 650 W to about 800 W, a bias power of about 100 W to about 120 W, and a pressure of about 60 mTorr to about 200 mTorr, using one or more of Cl$_2$, HBr, He, or other suitable gas as etching gases. The patterned photo-sensitive layer 400 is optionally stripped thereafter.

Figure 3D:
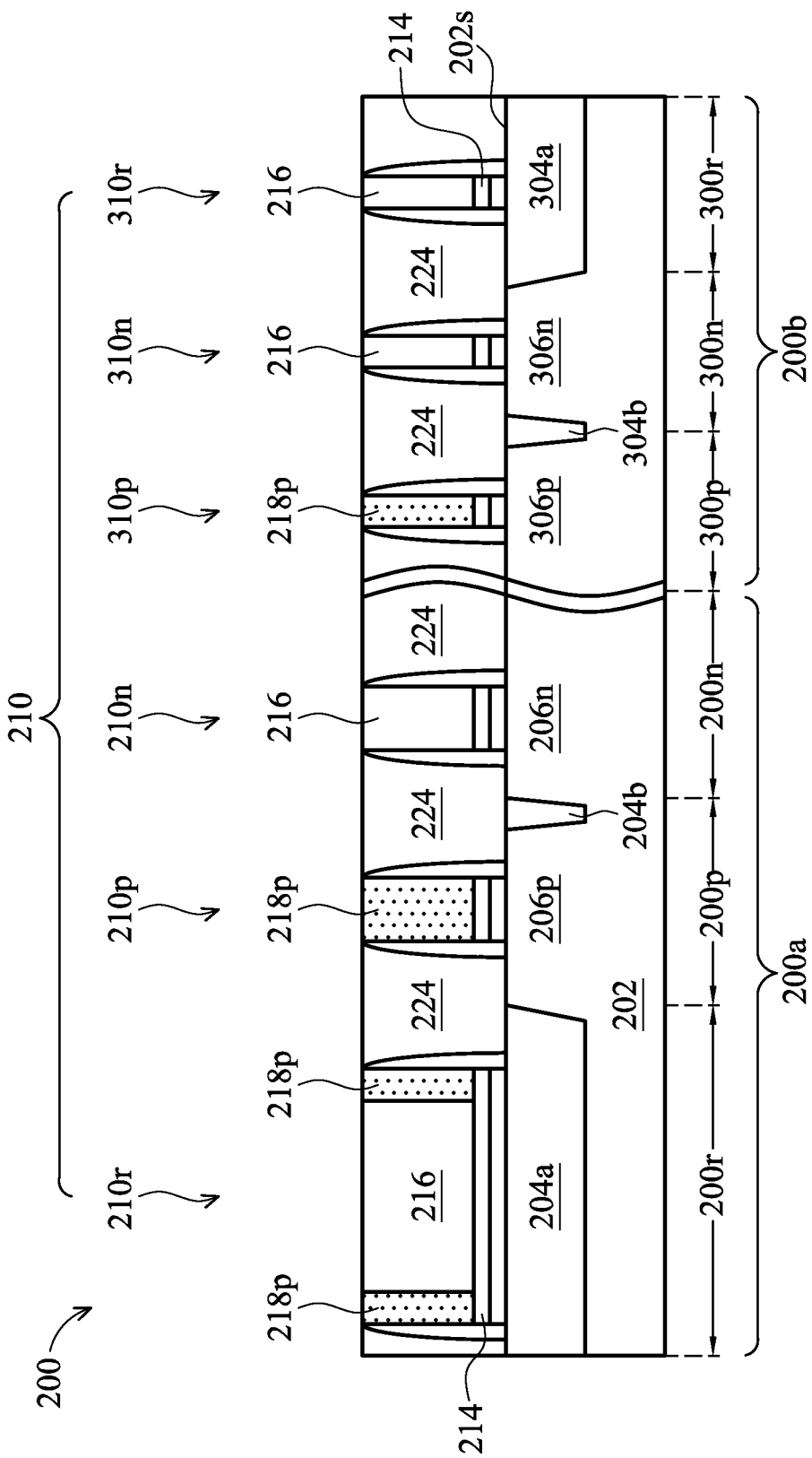

The method 100 in FIG. 1 continues with step 108 in which the structure in FIG. 3D is produced by filling the first subset of openings 208p, 308p with a first metal material 218p to form a plurality of P-metal gate features 200p, 300p (i.e. P-metal gate area 200pb and dummy P-metal gate area 300pb in FIG. 2C). In some embodiments, the first metal material 218p comprises a P-work-function metal. In some embodiments, the P-work-function metal comprises a metal such as TiN, WN, TaN, Ru, or other suitable material. The P-work-function metal is formed by ALD, CVD or other suitable technique. The, the first metal material 218p is first deposited to substantially fill the first set of openings 208p, 308p and the third set of openings 208a, 208b. Then, a CMP process is performed to remove a portion of the first metal material 218p outside of the first set of openings 208p, 308p and the third set of openings 208a, 208b. The CMP process optionally stops when reaching the insulation layer 224, providing a substantially planar surface.

Also referring to FIG. 3D, the third set of openings 208a, 208b is filled with the first metal material 218p to form conductive contacts of the resistor feature 200r comprising a plurality of resistor areas 200r. In some embodiments, the plurality of resistor areas 200r comprise poly-silicon 216. In some embodiments, the plurality of resistor areas 200r comprise TiN 214. The dummy resistor feature 300r comprise a plurality of dummy resistor areas 300r. In some embodiments, the plurality of dummy resistor areas 300r comprise poly-silicon 216. In some embodiments, the plurality of dummy resistor areas 300r comprise TiN 214.

Figure 3E:
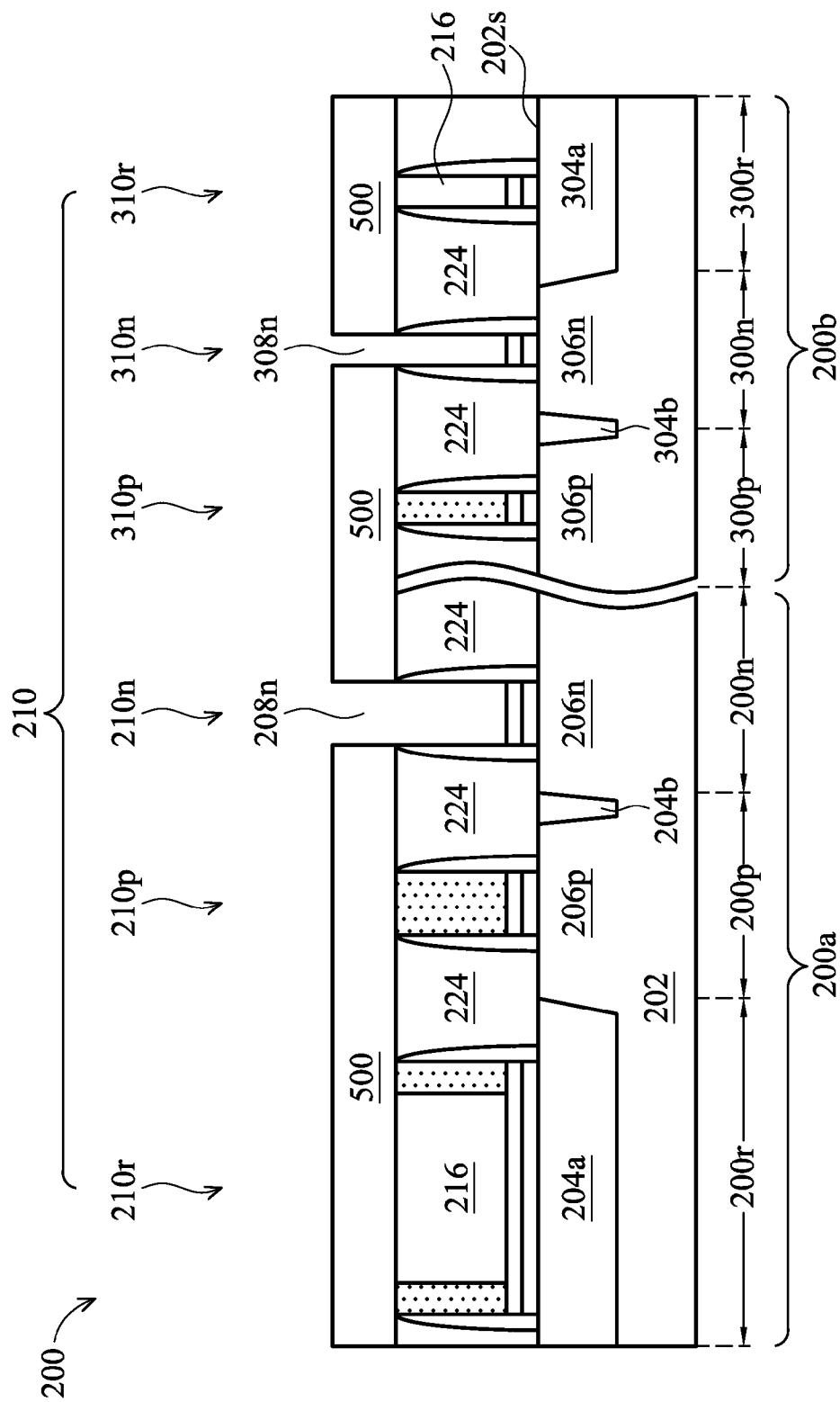

The method 100 in FIG. 1 continues with step 110 in which the structure in FIG. 3E is produced by removing the second subset (i.e., 210n and 310n) of the plurality of the dummy gate electrodes 210 to form a second set of openings 208n, 308n. Using a patterned photo-sensitive layer 500 as a mask, the second subset (i.e., 210n and 310n) of the plurality of the dummy gate electrodes 210 is removed to form the second set of openings 208n, 308n while the dummy gate electrode 310r and the third portion 210rc of the dummy gate electrode 210r are covered by the patterned photo-sensitive layer 500.

In some embodiments, the second subset (i.e., 210n and 310n) of the plurality of the dummy gate electrodes 210 are removed using a dry etch process. In some embodiments, the dry etch process is performed under a source power of about 650 W to about 800 W, a bias power of about 100 W to about 120 W, and a pressure of about 60 mTorr to about 200 mTorr, using Cl$_2$, HBr, He, or other suitable gas as etching gases. The patterned photo-sensitive layer 500 is optionally stripped thereafter.

Figure 3F:
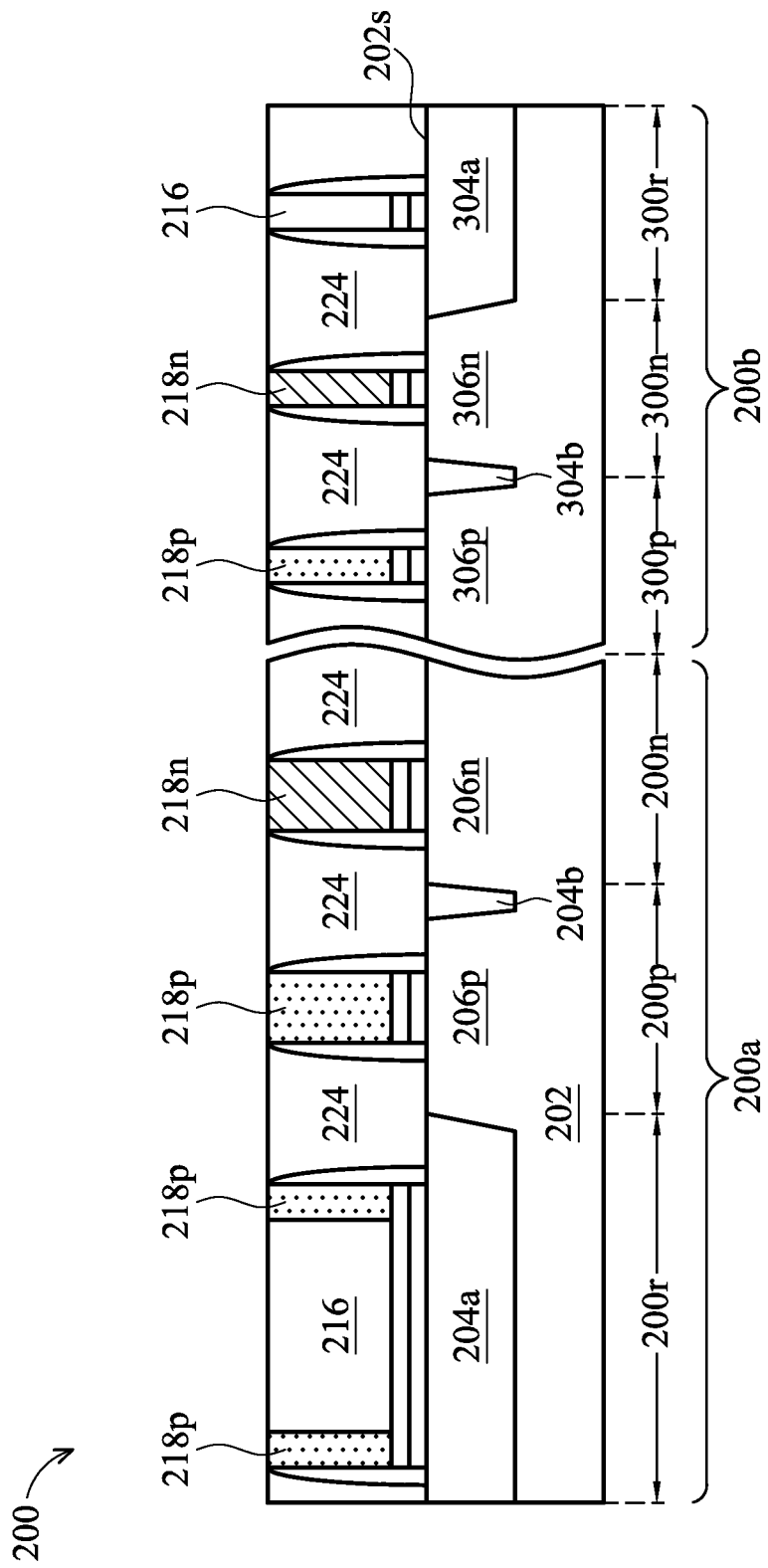

The method 100 in FIG. 1 continues with step 112 in which the structure in FIG. 3F is produced by filling the second subset of openings 208n, 308n with a second metal material 218n to form a plurality of N-metal gate features 200n, 300n (i.e. N-metal gate area 200nb and dummy N-metal gate area 300nb in FIG. 2C). The second metal material 218n comprises an N-work-function metal or other suitable material. The N-work-function metal comprises one or more of Ti, Ag, Al, TiAl, TiAlN, TaC, TaCN, TaSiN, Mn, Zr, or other suitable metal. The N-work-function metal may is formed by ALD, PVD, sputtering or other suitable technique. The second metal material 218n is first deposited to substantially fill the second set of openings 208n, 308n. A CMP process is performed to remove a portion of the second metal material 218n outside of the second set of openings 208n, 308n. The CMP process is optionally stopped when reaching the insulation layer 224, providing a substantially planar surface.

Figure 4B:
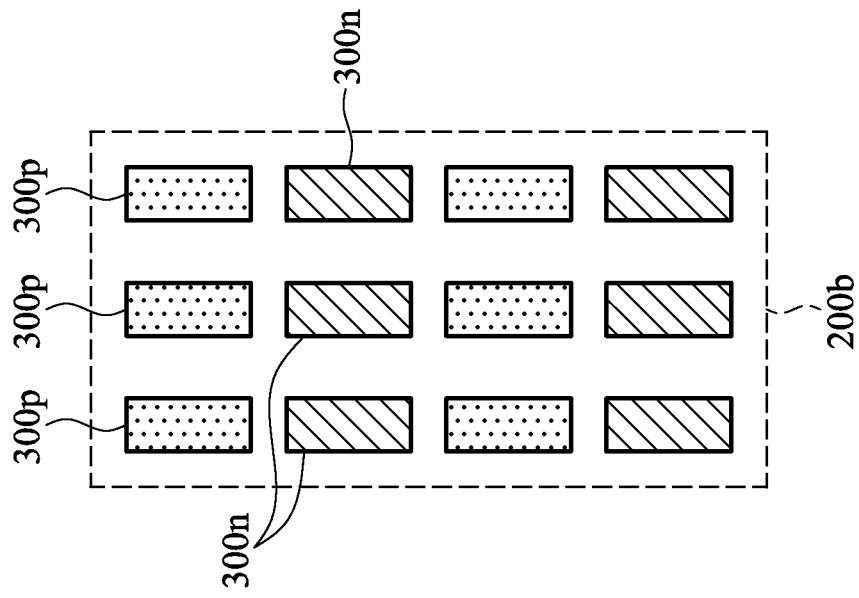
FIG. 4A-4B shows top views of a portion of one of the CMOS semiconductor dies in the exemplary wafer of FIGS. 2A and 2B according to various aspects of the present disclosure.
Figure 4A:
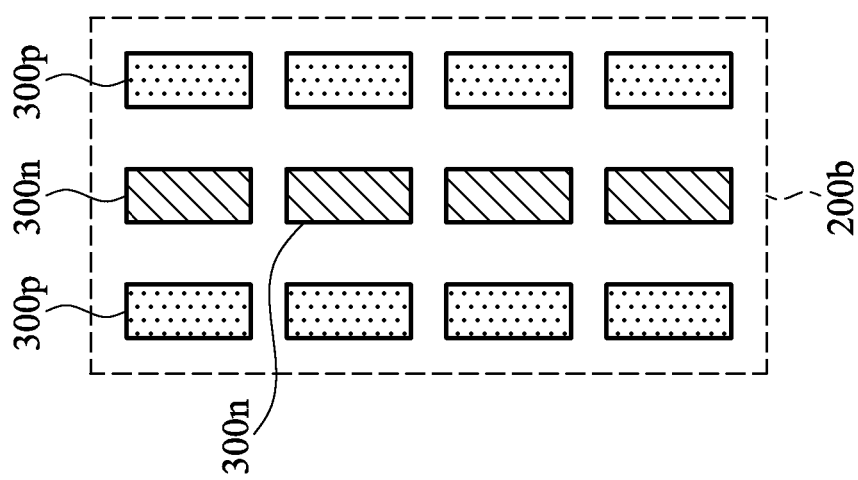

FIG. 4A-4B shows alternative top views of a portion of one of the CMOS semiconductor dies in the exemplary wafer of FIGS. 2A and 2B according to various aspects of the present disclosure. In the depicted embodiment, the second conductive region 200b has a plurality of dummy conductive structures (e.g., dummy P-metal gate features 300p, dummy N-metal gate features 300n, etc.) within the insulation layer 224. Each of the plurality of dummy P-metal gate areas 300p has a similar shape and size to each of the plurality of dummy N-metal gate areas 300n. The distributions of the plurality of dummy P-metal gate areas 300p and the plurality of dummy N-metal gate areas 300n are capable of being changed.

Figure 5B:
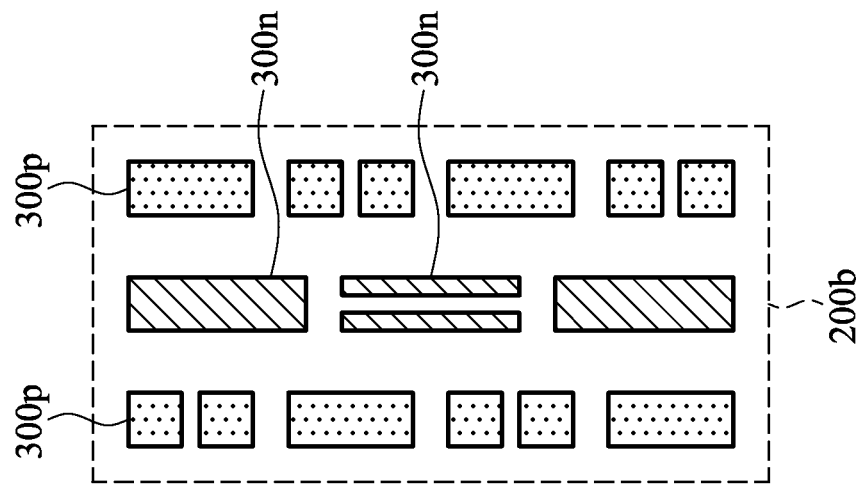
FIG. 5A-5B shows top views of a portion of one of the CMOS semiconductor dies in the exemplary wafer of FIGS. 2A and 2B according to various aspects of the present disclosure.
Figure 5A:
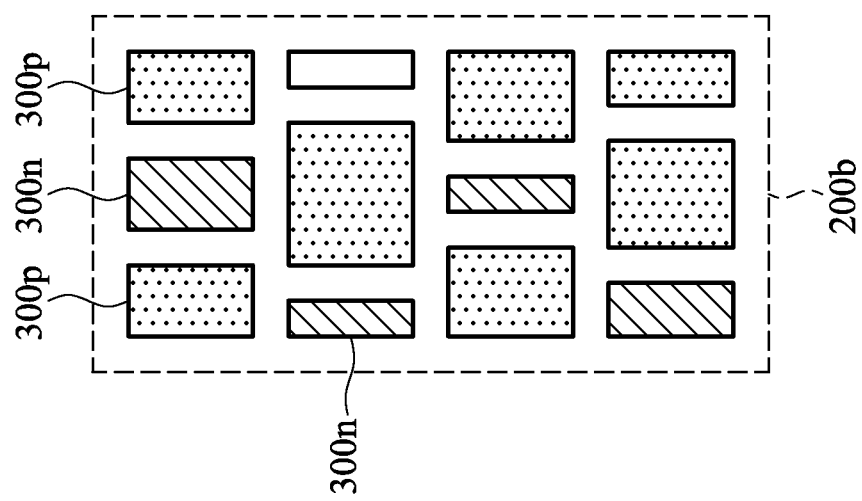

FIG. 5A-5B shows alternative top views of a portion of one of the CMOS semiconductor dies in the exemplary wafer of FIGS. 2A and 2B according to various aspects of the present disclosure. In the depicted embodiment, the second conductive region 200b has a plurality of dummy conductive structures (e.g., dummy P-metal gate features 300p, dummy N-metal gate features 300n, etc.) within the insulation layer 224. Each of the plurality of dummy P-metal gate areas 300p have different shapes and sizes compared to each of the plurality of dummy N-metal gate areas 300n. The distributions of the plurality of dummy P-metal gate areas 300p and the plurality of dummy N-metal gate areas 300n are capable of being changed.

In some embodiments, the CMOS semiconductor die 200 undergoes further CMOS processes to form various features such as contacts/vias, interconnect metal layers, dielectric layers, passivation layers, etc.

Figure 6:
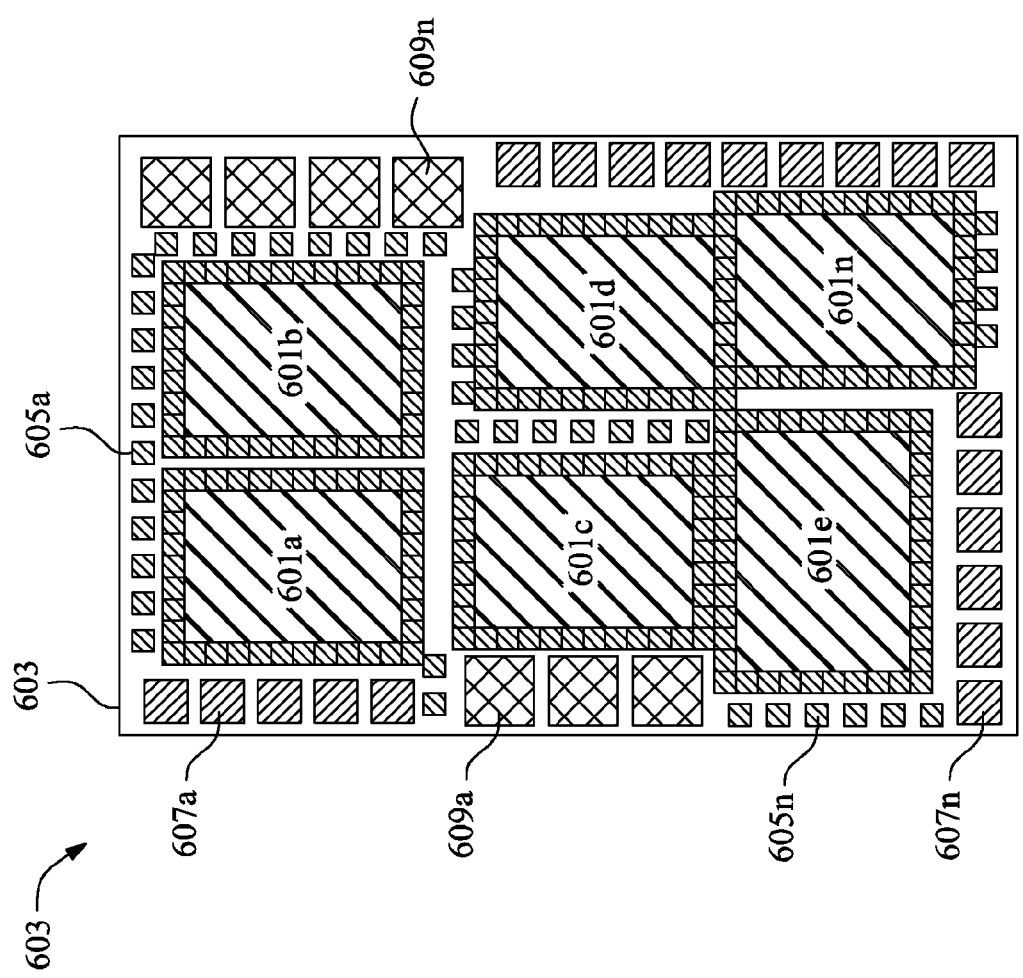
FIG. 6 is a plan view of a semiconductor device, in accordance with one or more embodiments.

FIG. 6 is a plan view of a semiconductor die 600, in accordance with one or more embodiments. Semiconductor die 600 comprises active regions 601a-601n over a substrate 603. Active regions 601a-601n are separated from one another by various distances or spacings. A first set of dummy blocks 605 are over the substrate 603. The first set of dummy blocks 603 comprise a plurality of dummy blocks 605a-605n. Some of the dummy blocks 605a-605n are in contact with one another. Some of the dummy blocks 605a-605n completely surround the active regions 601a-601n. The spacing between the active regions 601a-601n is occupied by dummy blocks 605a-605n of the first set of dummy blocks. A second set of dummy blocks 607a-607n are over the substrate 603. The dummy blocks 607a-607n of the second set of dummy blocks are outside of the spacing and farther from the active regions 601a-601n surrounded by the dummy blocks 605a-605n of the first set of dummy blocks than the dummy blocks 607a-607n of the first set of dummy blocks. Each of the dummy blocks 605a-605n of the first set of dummy blocks has individual surface areas. Each of the dummy blocks 607a-607n of the second set of dummy blocks has individual surface areas. The individual surface areas of each of the dummy blocks 607a-607n of the second set of dummy blocks is larger than the individual surface areas of each of the dummy blocks 605a-605n of the first set of dummy blocks.

A third set of dummy blocks 609a-609n are over the substrate. The dummy blocks 609a-609n of the third set of dummy blocks are farther from the active regions 601a-601n surrounded by the dummy blocks 605a-605n of the first set of dummy blocks than the dummy blocks 605a-605n of the first set of dummy blocks. Each of the dummy blocks 609a-609n of the third set of dummy blocks has individual surface areas. The individual surface areas of each of the dummy blocks 609a-609n of the third set of dummy blocks is larger than the individual surface area of each of the dummy blocks 607a-607n of the second set of dummy blocks.

The dummy blocks 605a-605n of the first set of dummy blocks range from about 10 nm×about 10 nm to about 1 um×about 1 um in size. The dummy blocks 609a-609n of the third set of dummy block range from about 1.2 um×about 1.2 um to about 1 mm×about 1 mm. The dummy blocks 607a-607n of the second set of dummy blocks are somewhere between the size of the dummy blocks 605a-605n of the first set of dummy blocks and the size of the dummy blocks 609a-609n of the third set of dummy blocks. In some embodiments, the spacing between the active regions 601a-601n is occupied only by dummy blocks 605a-605n of the first set of dummy blocks.

In some embodiments, the individual surface areas of each of the dummy blocks 605a-605n of the first set of dummy blocks are equal in size. In some embodiments, the individual surface areas of each of the dummy blocks 607a-607n of the second set of dummy blocks are equal in size. In some embodiments, the individual surface area of each of the dummy blocks 609a-609n of the third set of dummy blocks are equal in size. In some embodiments, the sizes of the dummy blocks 605a-605n of the first set of dummy blocks, the dummy blocks 607a-607n of the second set of dummy blocks, and the dummy blocks 609a-609n of the third set of dummy blocks, vary in surface area with respect to the dummy blocks within a particular set of dummy blocks to maximize an area of the substrate 603 that is covered by dummy blocks 605a-605n, 607a-607n, and 609a-609n.

In some embodiments, the dummy blocks 605a-605n of the first set of dummy blocks surrounding one of the active regions 601a-601n and the dummy blocks 605a-605n of the first set of dummy blocks surrounding another one of the active regions 601a-601n are in direct contact within the spacing between the two active regions. For example, active regions 601c and 601e are surrounded by dummy blocks 605a-605n of the first set of dummy blocks that are in contact with one another within the spacing between active region 601c and 601n. In some embodiments, the dummy blocks 605a-605n are in contact with one or more of the active regions 601a-601n. In some embodiments, the dummy blocks 605a-605n of the first set of dummy blocks are spaced from the active regions 601a-601n by a distance ranging from 0 nm to about 500 nm, which enables the dummy blocks 605a-605n of the first set of dummy blocks to be as close to the active regions 601a-601n as possible.

The dummy blocks 605a-605n of the first set of dummy blocks comprise at least one block feature such as a dummy N-metal gate area, a dummy P-metal gate area, or a dummy poly-silicon area within a boundary of at least one dummy block 605a-605n of the first set of dummy blocks. The dummy blocks 607a-607n of the second set of dummy blocks, and the dummy blocks 609a-609n of the third set of dummy blocks similarly comprise one or more block features such as dummy N-metal gate areas, dummy P-metal gate areas, or dummy poly-silicon areas within boundaries of the dummy blocks 607a-607n of the second set of dummy blocks, and the dummy blocks 609a-609n of the third set of dummy blocks. The dummy blocks 605a-605n of the first set of dummy blocks, the dummy blocks 607a-607n of the second set of dummy blocks, and the dummy blocks 609a-609n of the third set of dummy blocks comprise features similar to the active and dummy regions discussed with respect to FIGS. 1-5b, and are formed using similar processes to those discussed, for example with respect to FIGS. 1-5b. The dummy blocks 605a-605n of the first set of dummy blocks, the dummy blocks 607a-607n of the second set of dummy blocks, and the dummy blocks 609a-609n of the third set of dummy blocks are configured to reduce loading effects during an etching process and/or a chemical-mechanical polishing (CMP) process, thereby maintaining device uniformities of the active regions 601a-601n, which improves the semiconductor die 600's performance.

Figure 7:
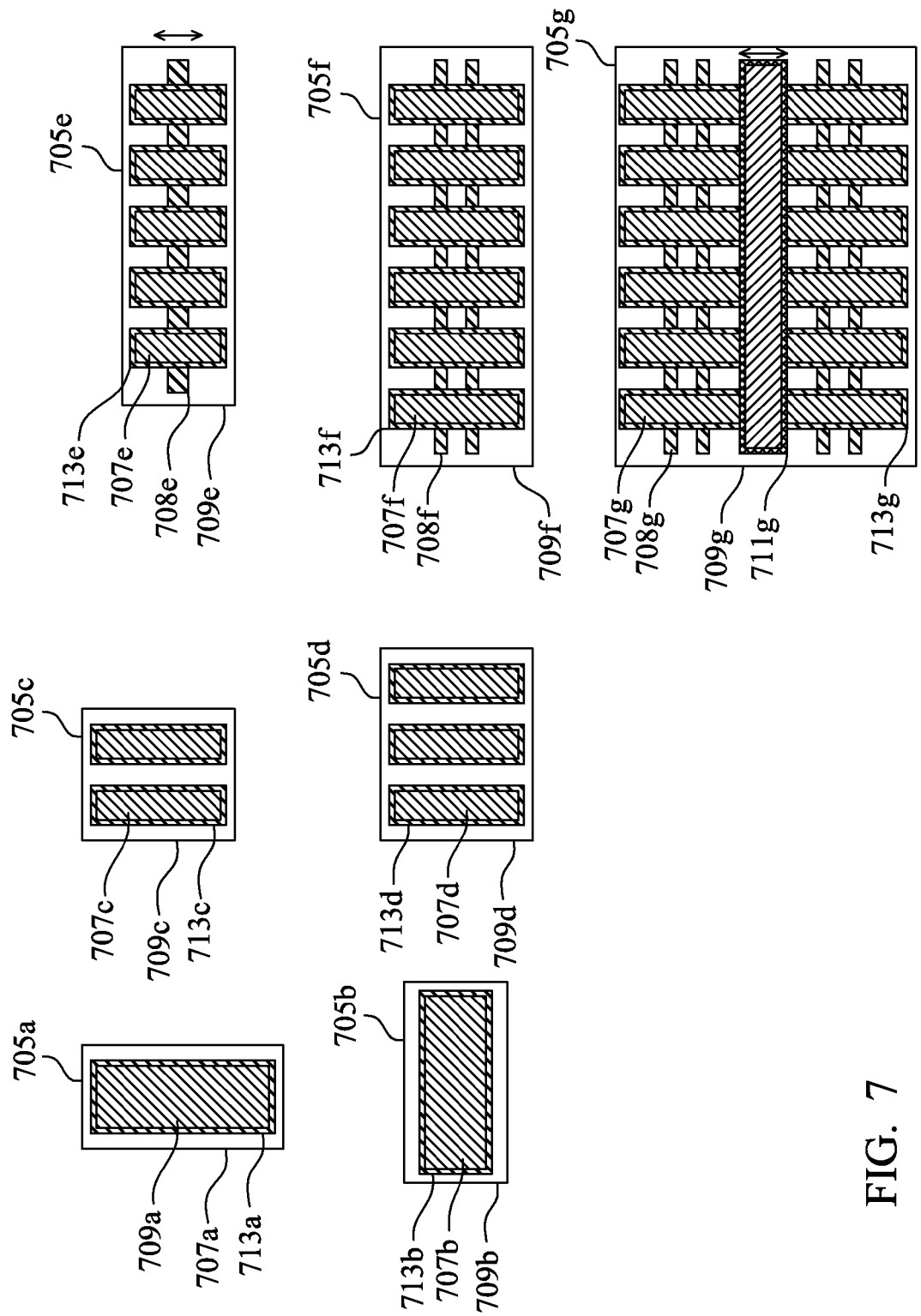
FIG. 7 is a plan view of example configurations of dummy blocks, in accordance with one or more embodiments.

FIG. 7 is plan view of different configurations of dummy blocks such as one or more of dummy blocks 605a-605n (FIG. 6) of the first set of dummy blocks, in accordance with one or more embodiments. A dummy block 705a is an example configuration of a dummy block 605 of the first set of dummy blocks. Dummy block 705a comprises at least one block feature 707a. The block feature 707a is at least one of a N-metal gate area, a P-metal gate area, or a poly-silicon area. The block feature 707a is within a boundary 709a of the dummy block 705a. The boundary 709a is a physical structure within which the block feature 707a is formed. In some embodiments, the boundary 709a is an imaginary line within which the block feature 707a is formed.

Dummy block 705b is an example configuration of a dummy block 605 of the first set of dummy blocks. Dummy block 705b comprises at least one block feature 707b. The block feature 707b is at least one of a N-metal gate area, a P-metal gate area, or a poly-silicon area. The block feature 707b in dummy block 705b is arranged differently from the block feature 707a of dummy block 707a. The block feature 707b is within a boundary 709b of the dummy block 705b. The boundary 709b is a physical structure within which the block feature 707b is formed. In some embodiments, the boundary 709b is an imaginary line within which the block feature 707b is formed.

Dummy block 705c is an example configuration of a dummy block 605 of the first set of dummy blocks. Dummy block 705c comprises at least two block features 707c. The block features 707c are similar to block features 707a and 707b, except for being more numerous in quantity. The block features 707c is within a boundary 709c of the dummy block 705c. The boundary 709c is a physical structure within which the block features 707c are formed. In some embodiments, the boundary 709c is an imaginary line within which the block features 707c is formed.

Dummy block 705d is an example configuration of a dummy block 605 of the first set of dummy blocks. Dummy block 705d comprises at least three block features 707d. The block features 707d are similar to block features 707a and 707b, except for being more numerous in quantity. The block features 707d is within a boundary 709d of the dummy block 705d. The boundary 709d is a physical structure within which the block features 707d are formed. In some embodiments, the boundary 709d is an imaginary line within which the block features 707d is formed.

Dummy block 705e is an example configuration of a dummy block 605 of the first set of dummy blocks. Dummy block 705e comprises more than one block feature 707e. The block features 707e are similar to block features 707a and 707b, except for being more numerous in quantity. The block features 707f are coupled by at least one fin structure 708e. The block features 707e and the fin structure 708e are within a boundary 709e of the dummy block 705e. The boundary 709e is a physical structure within which the block features 707e and the fin structure 708e are formed. In some embodiments, the boundary 709e is an imaginary line within which the block features 707e and the fin structure 708e are formed.

Dummy block 705f is an example configuration of a dummy block 605 of the first set of dummy blocks. Dummy block 705f comprises more than one block feature 707f. The block features 707f are similar to block features 707a and 707b, except for being more numerous in quantity. The block features 707f are coupled by at least two fin structures 708f. The block features 707f and the fin structures 708f are within a boundary 709f of the dummy block 705f. The boundary 709f is a physical structure within which the block features 707f and the fin structures 708f are formed. In some embodiments, the boundary 709f is an imaginary line within which the block features 707f and the fin structures 708f are formed.

Dummy block 705g is an example configuration of a dummy block 605 of the first set of dummy blocks. Dummy block 705g comprises more than one block feature 707g. The block features 707g are similar to block features 707a and 707b, except for being more numerous in quantity. The block features 707g are coupled by at least two fin structures 708g. The block features 707g and the fin structures 708g are within a boundary 709g of the dummy block 705g. The boundary 709g is a physical structure within which the block features 707g and the fin structures 708g are formed. In some embodiments, the boundary 709g is an imaginary line within which the block features 707g and the fin structures 708g are formed. Dummy block 705g includes a cut line 711g that extends substantially parallel to the fin structures 708g. At least two of the fin structures 708g are separated from one another by the cut line 711g.

Dummy blocks 705a-705g have oxide defined regions 713a-713g that surround the block features 707a-707g. In some embodiments, the block features 707a-707g are formed without being surrounded by oxide defined regions 713a-713g. If included in dummy blocks 705e-705g, for example, two or more block features 707e-707g are coupled by at least one oxide defined region 713e-713g. In some embodiments, at least two block features 707c-707g are coupled by at least two oxide defined regions 713e-713g. The at least two oxide defined regions 713e-713g are coupled between adjacent block features 707c-707g by, for example, one or more of the fin structures 708e-708g. In some embodiments, at least two oxide defined regions such as oxide defined regions 713g are separated by the cut line 711g.

Figure 8:
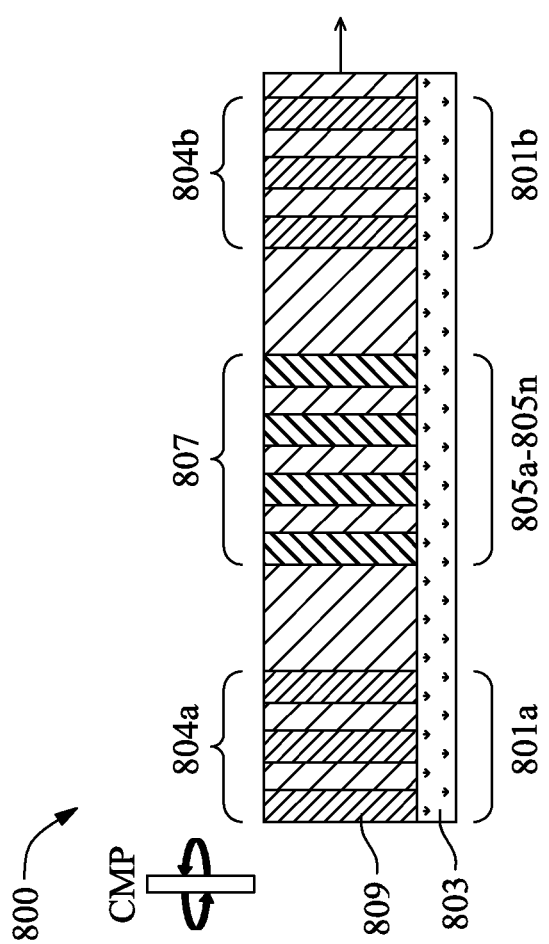
FIG. 8 is a cross section view of a semiconductor device undergoing a CMP process, in accordance with one or more embodiments.

FIG. 8 is a cross section view of a semiconductor device 800 undergoing a CMP process, in accordance with one or more embodiments. Semiconductor device 800 comprises many of the features discussed with respect to FIG. 6, with the reference numerals increased by 200. Semiconductor device 800 comprises at least two active regions 801a and 801b over a substrate 803. Active regions 801a and 801b comprise one or more active fin structures 804a and 804b. Dummy blocks 805a-805n of a first set of dummy blocks similar to dummy blocks 605a-605n (FIG. 6) include block features 807. Block features 807 are similar to block features 707a-707g (FIG. 7). The block features 807 are representative of one of the dummy blocks 805a-805n of the first set of dummy blocks having more than one block feature 807 within a boundary of the dummy block. Alternatively, the block features 807 are representative of two or more dummy bocks 805a-805n of the first set of dummy blocks are between the active regions 801a and 801b.

The semiconductor device 800 includes a first layer 809 over the substrate 803. The first layer 809 is an oxide over the substrate 803. In some embodiments, the first layer 809 is a shallow trench isolation feature. The first layer 809 is over the active regions 801a and 801b, and over the dummy blocks 805a-805n of the first set of dummy blocks. The block features 807 of the dummy blocks 805a-805n of the first set of dummy blocks are configured to support the first layer 809 between the one or more active fin structures 804a and 804b of the active regions 801a and 801b, thereby preventing the first layer 809 from dishing as a result of the CMP process.

Figure 9:
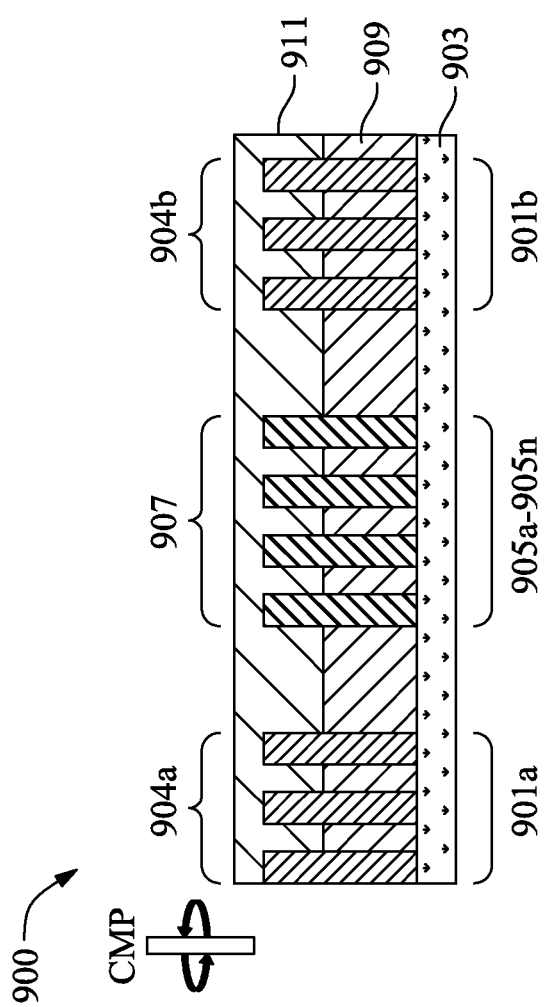
FIG. 9 is a cross section view of a semiconductor device undergoing a CMP process, in accordance with one or more embodiments.

FIG. 9 is a cross section view of a semiconductor device 900 undergoing a CMP process, in accordance with one or more embodiments. Semiconductor device 900 comprises many of the features discussed with respect to FIG. 8, with the reference numerals increased by 100. Semiconductor device 900 comprises a second layer 911 over first layer 909. The second layer 911 comprises a polymer, an oxide, or other suitable material. The second layer 911 is over the active regions 901a and 901b, and the dummy blocks 905a-905n of the first set of dummy blocks. The block features 907 of the dummy blocks 905a-905n of the first set of dummy blocks are configured to support the second layer 911 between the one or more active fin structures 904a and 904b of the active regions 901a and 901b, thereby preventing the second layer 911 from dishing as a result of the CMP process.

Figure 10:
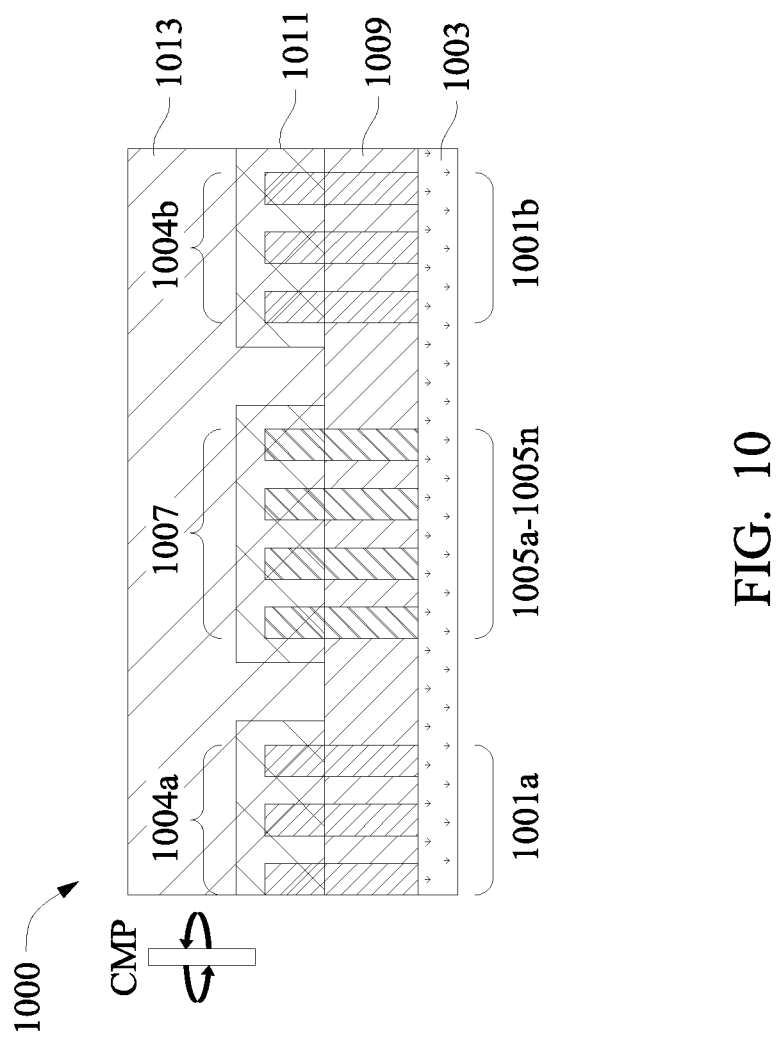
FIG. 10 is a cross section view of a semiconductor device undergoing a CMP process, in accordance with one or more embodiments.

FIG. 10 is a cross section view of a semiconductor device 1000 undergoing a CMP process, in accordance with one or more embodiments. Semiconductor device 1000 comprises many of the features discussed with respect to FIG. 9, with the reference numerals increased by 100. Semiconductor device 1000 comprises a third layer 1013 over second layer 1011. The third layer 1013 comprises a polymer, an oxide, or other suitable material. The third layer 1013 is over the active regions 1001a and 1001b, and the dummy blocks 1005a-1005n of the first set of dummy blocks. The block features 1007 of the dummy blocks 1005a-1005n of the first set of dummy blocks are configured to support the third layer 1013 between the one or more active fin structures 1004a and 1004b of the active regions 1001a and 1001b, thereby preventing the third layer 1013 from dishing as a result of the CMP process. The second layer 1011 is etched to remove one or more portions of the second layer 1011 before forming the third layer 1013 over the second layer 1011. The block features 1007 of the dummy blocks 1005a-1005n of the first set of dummy blocks are configured to support the second layer 1011 between the one or more active fin structures 1004a and 1004b of the active regions 1001a and 1001b, thereby preventing deformations that may occur as a result of the etching process caused by a loading effect associated with the etching process. Accordingly, the block features 1007 of the dummy blocks 1005a-1005n of the first set of dummy blocks are configured to help maintain device uniformities of the one or more active fin structures 1004a and 1004b of the active regions 1001a and 1001b, thereby improving the semiconductor device 1000's performance.

Figure 11:
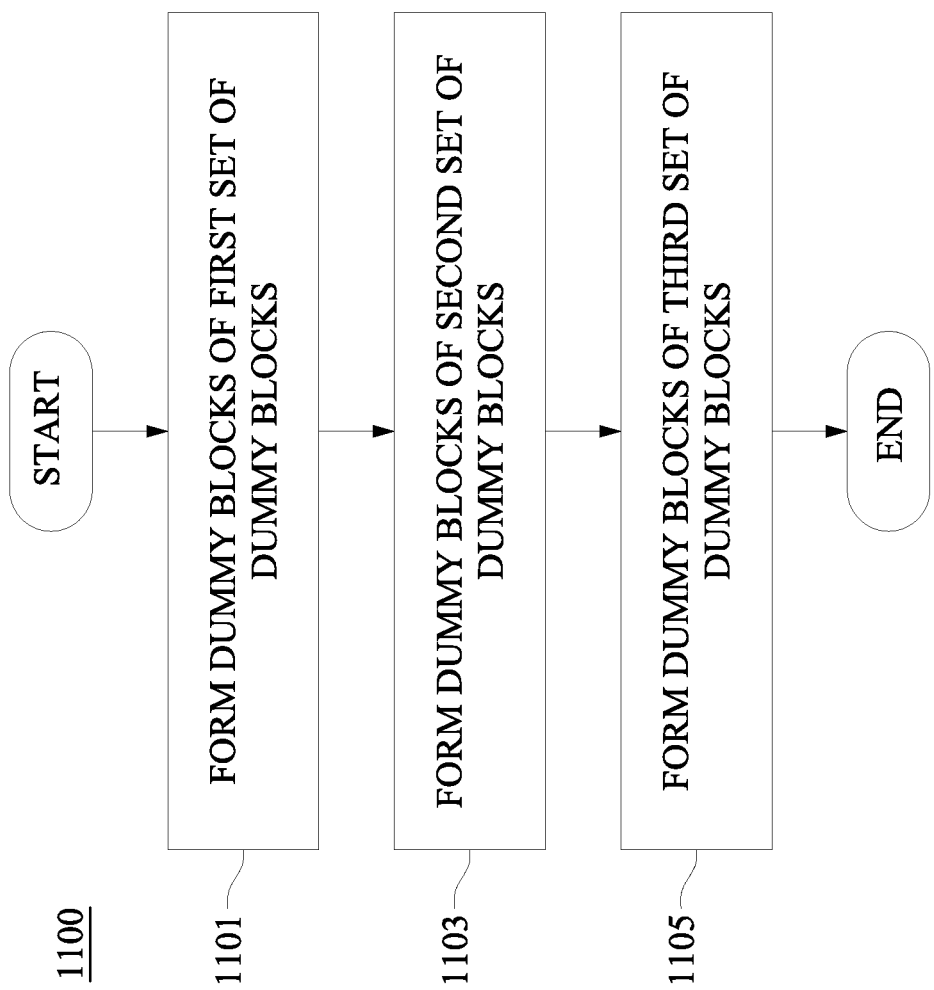
FIG. 11 is a flowchart of a process of forming a semiconductor device, in accordance with one or more embodiments.

FIG. 11 is a flowchart of a method 1100 of forming a semiconductor device, in accordance with one or more embodiments. In step 1101, a first set of dummy blocks such as dummy blocks 605a-605n (FIG. 6) of the first set of dummy blocks are formed over a substrate such as substrate 603 (FIG. 6). The first set of dummy blocks comprise a plurality of dummy blocks in contact with one another and completely surrounding at least one active region of two or more active regions such as active regions 601a-601n (FIG. 6). In step 1103, a second set of dummy blocks such as dummy blocks 607a-607n are formed over the substrate. The dummy blocks of the second set of dummy blocks are formed farther from the at least one active region surrounded by the dummy blocks of the first set of dummy blocks than the dummy blocks of the first set of dummy blocks. Each of the dummy blocks of the first set of dummy blocks has individual surface areas. Each of the dummy blocks of the second set of dummy blocks has individual surface areas. The individual surface areas of each of the dummy blocks of the second set of dummy blocks is larger than the individual surface areas of each of the dummy blocks of the first set of dummy blocks. In step 1105, a third set of dummy blocks such as dummy blocks 609a-609n (FIG. 6) of the third set of dummy blocks are formed over the substrate. The dummy blocks of the third set of dummy blocks are formed farther from the at least one active region surrounded by the dummy blocks of the first set of dummy blocks than the dummy blocks of the first set of dummy blocks. Each of the dummy blocks of the third set of dummy blocks has individual surface areas. The individual surface areas of each of the dummy blocks of the third set of dummy blocks is larger than the individual surface area of each of the dummy blocks of the second set of dummy blocks.

In some embodiments, the dummy blocks of the first set of dummy blocks are formed or inserted before the dummy blocks of the second set of dummy blocks and/or the dummy blocks of the third set of dummy blocks. By forming the dummy blocks of the first set of dummy blocks before the dummy blocks of the second set of dummy blocks and/or the dummy blocks of the third set of dummy blocks, global density uniformity of the dummy blocks over the substrate is improved, which reduces or eliminates dishing in a layer of a semiconductor device that often occurs during a CMP process. The reduction or elimination of dishing in a layer of a semiconductor device improves, for example, semiconductor device performance that could be adversely affected by dishing in one or more layers of a semiconductor device.

An aspect of this description relates to a semiconductor die comprising two or more active regions over a substrate. The semiconductor die also comprises a first set of dummy blocks over the substrate. The first set of dummy blocks comprise a plurality of dummy blocks in contact with one another and completely surrounding at least one active region of the two or more active regions. The semiconductor die further comprises a second set of dummy blocks over the substrate. The dummy blocks of the second set of dummy blocks are farther from the at least one active region surrounded by the dummy blocks of the first set of dummy blocks than the dummy blocks of the first set of dummy blocks. Each of the dummy blocks of the first set of dummy blocks has individual surface areas. Each of the dummy blocks of the second set of dummy blocks has individual surface areas. The individual surface areas of each of the dummy blocks of the second set of dummy blocks is larger than the individual surface areas of each of the dummy blocks of the first set of dummy blocks.

Another aspect of this description relates to method of forming a semiconductor device. The method comprises forming a first set of dummy blocks over a substrate. The first set of dummy blocks are formed comprising a plurality of dummy blocks in contact with one another and completely surrounding at least one active region of two or more active regions. The method also comprises forming a second set of dummy blocks over the substrate. The dummy blocks of the second set of dummy blocks are formed farther from the at least one active region surrounded by the dummy blocks of the first set of dummy blocks than the dummy blocks of the first set of dummy blocks. Each of the dummy blocks of the first set of dummy blocks has individual surface areas. Each of the dummy blocks of the second set of dummy blocks has individual surface areas. The individual surface areas of each of the dummy blocks of the second set of dummy blocks is larger than the individual surface areas of each of the dummy blocks of the first set of dummy blocks.

A further aspect of this description relates to a semiconductor die comprising two or more active regions over a substrate. The two or more active regions are separated by a spacing. The semiconductor device also comprises a first set of dummy blocks over the substrate. The first set of dummy blocks comprise a plurality of dummy blocks in contact with one another and completely surrounding at least one active region of the two or more active regions. The spacing is occupied by dummy blocks of the first set of dummy blocks. The semiconductor device further comprises a second set of dummy blocks over the substrate. The dummy blocks of the second set of dummy blocks are outside of the spacing and farther from the at least one active region surrounded by the dummy blocks of the first set of dummy blocks than the dummy blocks of the first set of dummy blocks. Each of the dummy blocks of the first set of dummy blocks has individual surface areas. Each of the dummy blocks of the second set of dummy blocks has individual surface areas. The individual surface areas of each of the dummy blocks of the second set of dummy blocks is larger than the individual surface areas of each of the dummy blocks of the first set of dummy blocks.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor die comprising:
   two or more active regions over a substrate, comprising a first active region and a second active region adjacent to the first active region;
   a first set of dummy blocks over the substrate, the first set of dummy blocks comprising:
      a first group of dummy blocks having adjacent dummy blocks in direct physical contact with one another and surrounding the first active region, and
      a second group of dummy blocks adjacent to the first group of dummy blocks and spaced from one another by an insulation layer that directly abuts adjacent dummy blocks of the second group, the second group of dummy blocks being farther from the first active region than the first group of dummy blocks,
      wherein each dummy block of the first group and each dummy block of the second group have a same surface area, and the dummy blocks of the first group and the dummy blocks of the second group have different pitches;
   a second set of dummy blocks over the substrate, the dummy blocks of the second set of dummy blocks being farther from the first active region than the dummy blocks of the first group of dummy blocks,
   wherein each of the dummy blocks of the first set of dummy blocks has an individual surface area, each of the dummy blocks of the second set of dummy blocks has an individual surface area, and the individual surface area of each of the dummy blocks of the second set of dummy blocks is larger than the individual surface area of each of the dummy blocks of the first set of dummy blocks, and
   wherein at least one dummy block of the first set of dummy blocks or the second set of dummy blocks comprises a first block feature having at least one dummy gate structure.

2. The semiconductor die of claim 1, wherein the individual surface areas of the dummy blocks of the first set of dummy blocks are equal in size.

3. The semiconductor die of claim 1, wherein the individual surface areas of the dummy blocks of the second set of dummy blocks are equal in size.

4. The semiconductor die of claim 1, further comprising:
   a third set of dummy blocks over the substrate, the dummy blocks of the third set of dummy blocks being farther from the first active region than the dummy blocks of the first group of dummy blocks,
   wherein each of the dummy blocks of the third set of dummy blocks has an individual surface area, and each of the individual surface areas of the dummy blocks of the third set of dummy blocks is larger than a largest individual surface area of the dummy blocks of the second set of dummy blocks.

5. The semiconductor die of claim 1, wherein the first active region and the second active region of the two or more active regions are separated by a spacing, and the spacing is occupied by only dummy blocks of the first set of dummy blocks.

6. The semiconductor die of claim 1, wherein the second active region of the two or more active regions is completely surrounded by dummy blocks of the first set of dummy blocks, wherein the dummy blocks of the first set of dummy blocks surrounding the second active region are different from the dummy blocks of the first set of dummy blocks surrounding the first active region.

7. The semiconductor die of claim 1, wherein the dummy blocks of the first set of dummy blocks surrounding the first active region of the two or more active regions and the dummy blocks of the first set of dummy blocks surrounding the second active region of the two or more active regions are in direct physical contact within the spacing.

8. The semiconductor device of claim 1, wherein the at least one dummy gate structure comprises a N-metal gate structure, a P-metal gate structure, or a poly-silicon gate structure.

9. The semiconductor device of claim 8, wherein
   the two or more active regions comprise one or more active fin structures, and the semiconductor device further comprises:
   a first layer over the at least two active regions and the dummy blocks of the first set of dummy blocks, the first layer being supported by the first block feature and by a second block feature of the first set of dummy blocks, the active fin structures being between the first block feature and the second block feature.

10. The semiconductor device of claim 9, further comprising:
    a second layer over the first layer, the second layer being over the two or more active regions and the dummy blocks of the first set of dummy blocks, the second layer being supported by the first block feature and by the second block feature.

11. The semiconductor device of claim 1, wherein at least one dummy block of the first set of dummy blocks further comprises a second block feature, the first block feature and the second block feature coupled by at least one fin.

12. The semiconductor device of claim 11, wherein the first block feature and the second block feature are coupled by at least two fins, and the at least two fins are separated by a cut line.

13. The semiconductor device of claim 1, wherein at least one dummy block of the first set of dummy blocks further comprises a second block feature coupled to the first block feature by at least one oxide defined region.

14. The semiconductor device of claim 13, wherein the first block feature and the second block feature are coupled by at least two oxide defined regions, and the at least two oxide defined regions are separated by a cut line.

15. A method, comprising:
forming a first set of dummy blocks over a substrate, the first set of dummy blocks comprising a first group of dummy blocks having adjacent dummy blocks in direct physical contact with one another and surrounding a first active region of two or more active regions, and a second group of dummy blocks adjacent to the first group of dummy blocks and spaced from one another by an insulation layer that directly abuts adjacent dummy blocks of the second group, each dummy block in the first set of dummy blocks having a first surface area, the first group of dummy blocks comprising a single dummy block in a first direction from an interior of the first active region and having a pitch different from a pitch of the second group of dummy blocks, the second group of dummy blocks being farther from the first active region than the first group of dummy blocks;
forming a second set of dummy blocks over the substrate, the dummy blocks of the second set of dummy blocks formed farther from the first active region than the dummy blocks of the first group of dummy blocks, and the first active region being spaced from a closest dummy block of the second set of dummy blocks in the first direction,
wherein at least one dummy block of the first group of dummy blocks or the second set of dummy blocks comprises a dummy gate, and
wherein each of the dummy blocks of the first set of dummy blocks has an individual surface area, each of the dummy blocks of the second set of dummy blocks has an individual surface area, and the individual surface area of each of the dummy blocks of the second set of dummy blocks is larger than the individual surface area of each of the dummy blocks of the first set of dummy blocks,
at least two dummy blocks of the first set of dummy blocks, comprising one dummy block of the first group of dummy blocks and one dummy block from the second group of dummy blocks, are formed between the first active region and the closest dummy block of the second set of dummy blocks with each dummy block of the first group of dummy blocks being separated from each dummy block of the second group along the first direction.

16. The method of claim 15, further comprising:
forming a third set of dummy blocks over the substrate, the dummy blocks of the third set of dummy blocks being formed farther from the first active region surrounded by the dummy blocks of the first set of dummy blocks than the dummy blocks of the first set of dummy blocks,
wherein each of the dummy blocks of the third set of dummy blocks have individual surface areas, and the individual surface area of each of the dummy blocks of the third set of dummy blocks is larger than the individual surface area of each of the dummy blocks of the second set of dummy blocks.

17. The method of claim 16, wherein the two or more active regions are separated by a spacing, and the spacing is filled by at least two dummy blocks of the first set of dummy blocks.

18. The method of claim 15, wherein the dummy gate comprises at least one of a N-metal gate structure, or a P-metal gate structure, or a poly-silicon gate structure within a boundary of at least one dummy block of the first set of dummy blocks.

19. A semiconductor die comprising:
two or more active regions over a substrate, the two or more active regions being separated by a spacing;
a first set of dummy blocks over the substrate, the first set of dummy blocks comprising a first group of dummy blocks having adjacent dummy blocks in direct physical contact with one another and surrounding a first active region of the two or more active regions, and a second group of dummy blocks adjacent to the first group of dummy blocks and spaced from one another by an insulation layer that directly abuts adjacent dummy blocks of the second group, the second group of dummy blocks being farther from the first active region than the first group of dummy blocks, and the spacing being occupied by dummy blocks of the first set of dummy blocks, wherein the dummy blocks of the first set of dummy blocks comprise at least one block feature, the at least one block feature comprising at least one dummy gate, and wherein each dummy block of the first group and each dummy block of the second group have a same surface area, and the dummy blocks of the first group and the dummy blocks of the second group have different pitches;
a second set of dummy blocks over the substrate, the dummy blocks of the second set of dummy blocks being outside of the spacing and farther from the first active region surrounded by the dummy blocks of the first set of dummy blocks than the dummy blocks of the first set of dummy blocks,
wherein each of the dummy blocks of the first set of dummy blocks has an individual surface area, each of the dummy blocks of the second set of dummy blocks has an individual surface area, and the individual surface area of each of the dummy blocks of the second set of dummy blocks is larger than the individual surface area of each of the dummy blocks of the first set of dummy blocks, and at least one dummy block of the first set of dummy blocks is closer to an edge of the semiconductor die than each dummy block of the second set of dummy blocks.

20. The semiconductor die of claim 19, wherein the at least one dummy gate comprises a N-metal gate structure, or a P-metal gate structure, or a poly-silicon gate structure within a boundary of at least one dummy block of the first set of dummy blocks.

* * * * *